US012751036B2

(12) United States Patent
Zhang et al.

(10) Patent No.: US 12,751,036 B2
(45) Date of Patent: Sep. 29, 2026

(54) CHARGE BALANCED POWER TRANSISTORS

(71) Applicant: Virginia Tech Intellectual Properties, Inc., Blacksburg, VA (US)

(72) Inventors: Yuhao Zhang, Blacksburg, VA (US); Ming Xiao, Blacksburg, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 680 days.

(21) Appl. No.: 17/939,377

(22) Filed: Sep. 7, 2022

(65) Prior Publication Data

US 2024/0079487 A1 Mar. 7, 2024

(51) Int. Cl.
*H10D 30/47* (2025.01)
*H10D 62/824* (2025.01)
*H10D 62/85* (2025.01)

(52) U.S. Cl.
CPC ....... *H10D 30/4755* (2025.01); *H10D 62/824* (2025.01); *H10D 62/8503* (2025.01)

(58) Field of Classification Search
CPC ............. H10D 30/4755; H10D 62/824; H10D 62/8503; H10D 30/4732; H10D 64/513; H10D 62/126; H10D 62/109; H10D 62/343
USPC ......................................... 257/194, 295, 330
See application file for complete search history.

(56) References Cited

U.S. PATENT DOCUMENTS 9,741,840 B1 8/2017 Moens
2007/0158692 A1* 7/2007 Nakayama ......... H10D 30/4755 257/E29.255
2013/0313560 A1* 11/2013 Khalil .................. H10D 30/014 257/E21.403
2013/0313611 A1* 11/2013 Khalil .................. H10D 30/015 257/E21.403
2013/0313612 A1* 11/2013 Khalil .................. H10D 64/513 257/E29.252
(Continued)

OTHER PUBLICATIONS

J.W.Palmour et al., 2014 Int. Symp. Power Semicond. Devices ICs, pp. 79.
(Continued)

*Primary Examiner* — Mounir S Amer
*Assistant Examiner* — Nicholas B Michaud
(74) *Attorney, Agent, or Firm* — Thomas | Horstemeyer, LLP

(57) ABSTRACT

A semiconductor device includes a semiconductor region having at least one two-dimensional carrier channel of a first conductivity type, the first conductivity type being one of a n-type and a p-type conductivity, the at least one two-dimensional channel having a net charge, the semiconductor region including a first semiconductor region coupled with a drain terminal and a second semiconductor region coupled with a source terminal; and a third semiconductor region of a second conductivity type electrically coupled with a gate terminal, having a gate region and a net charge region, the net charge region disposed over the first semiconductor region and having a net charge in a depletion region that is substantially equal to the net charge of the at least one two-dimensional channel in the first semiconductor region when the semiconductor device is in an off-state.

25 Claims, 26 Drawing Sheets

(56) References Cited

U.S. PATENT DOCUMENTS

| | | | | |
|---|---|---|---|---|
| 2017/0117403 | A1* | 4/2017 | Okita | H10D 64/512 |
| 2019/0198615 | A1* | 6/2019 | Mishra | H10D 30/015 |
| 2020/0373383 | A1* | 11/2020 | Zhang | H10D 30/4755 |
| 2022/0157981 | A1* | 5/2022 | Gupta | H10D 62/8503 |
| 2023/0352574 | A1* | 11/2023 | Tu | H10D 30/475 |
| 2023/0411506 | A1* | 12/2023 | Okita | H10D 62/343 |

OTHER PUBLICATIONS

J. Liu et al., in 2020 IEEE Int. Electron Devices Meet., pp. 23.2.
M. Yanagihara et al., Phys. Status Solidi A., vol. 206, pp. 1221, 2009.
M. Xiao et al., IEEE Electron Device Lett., vol. 41, No. 8, pp. 1177, 2020.
M. Xiao et al., in 2020 IEEE Int. Electron Devices Meet., pp. 5.4.
M. Xiao et al., IEEE Electron Device Lett., vol. 42, No. 6, pp. 808, 2021.
R. S. Howell et al., in 2014 IEEE Int. Electron Devices Meet., pp. 11.5.
L. Nela et al., Nat. Electron, vol. 4, pp. 284, 2021.
Hyun-Seop Kim et al., Effects of Recessed-Gate Structure on AlGaN/GaN-on-SiC MIS-HEMTs with Thin AlOxNy MIS Gate, Feb. 15, 2020.
R. Zhang et al., IEEE Trans. Power Electron., vol. 35, pp. 13409, 2020.
Q. Song et al., IEEE Trans. Power Electron., vol. 37, pp. 4148, 2022.
M. Xiao et al., in 2021 IEEE Int. Electron Devices Meet., pp. 5.5.

* cited by examiner

CHARGE BALANCED POWER TRANSISTORS

TECHNICAL FIELD

This disclosure relates to the semiconductor devices, an in particular to multi-channel transistors.

DESCRIPTION OF THE RELATED TECHNOLOGY

Medium and high voltage devices are commonly used in power electronic circuitry such as, for example, those used in energy processing, electric grids, transportation, etc. One example of a high voltage device incudes bipolar silicon insulated gate bipolar transistor (IGBT) which have operating voltages up to about 6.5 kV. But IGBTs suffer from slow switching speeds. Silicon-carbide (SiC) devices are also popular and can include, for example, SiC metal oxide semiconductor field effect transistors (MOSFETs) that can operate between about 3.3 and about 10 kV. Gallium-nitride (GaN) based transistors can exhibit physical properties that are superior to those of both the Si based and SiC based transistors. For example, lateral GaN high-electron-mobility transistors (HEMT) operating at about 900 V have been commercialized, and industrial vertical GaN field effect transistors (FETs) are available at 1.2 kV [2]. These devices can have a breakdown voltage (BV) up to about 2 kV for large overvoltage margin, e.g., 1.4 to about 2 kV BV in 650 V rated GaN HEMTs [3], [4]. Some of these transistors can be lateral HEMTs. As one example, some GaN devices can have a BV of up to over 10 kV [5], [6].

SUMMARY

In some aspects, the techniques described herein relate to a semiconductor device, including: a semiconductor region having at least one two-dimensional carrier channel of a first conductivity type, the first conductivity type being one of a n-type and a p-type conductivity, the at least one two-dimensional channel having a net charge, the semiconductor region including a first semiconductor region coupled with a drain terminal and a second semiconductor region coupled with a source terminal; a third semiconductor region of a second conductivity type electrically coupled with a gate terminal, the second conductivity type being the other of the n-type and the p-type conductivity, having a gate region and a net charge region, the gate region being disposed between the first semiconductor region and the second semiconductor region and the net charge region disposed over the first semiconductor region, the net charge region having a net charge in a depletion region that is substantially equal to the net charge of the at least one two-dimensional channel in the first semiconductor region when the semiconductor device is in an off-state.

In some aspects, the techniques described herein relate to a semiconductor device, wherein the net charge of the net charge region is a function of a thickness of the depletion region of the net charge region and an acceptor/donor concentration in the depletion region of the net charge region. In some aspects, the techniques described herein relate to a semiconductor device, further including: a fourth semiconductor region of the first conductivity type positioned between the first semiconductor region and the third semiconductor region and between the second semiconductor region and the third semiconductor region, the fourth semiconductor region being in contact with the at least one two-dimensional channel in each of the first semiconductor region and the second semiconductor region. In some aspects, the techniques described herein relate to a semiconductor device, wherein the net charge region extends over an entirety of the first semiconductor region between the gate terminal and the drain terminal.

In some aspects, the techniques described herein relate to a semiconductor device, wherein the net charge region includes a plurality of segments that extend between the gate terminal and the drain terminal. In some aspects, the techniques described herein relate to a semiconductor device, wherein the net charge region includes a gate-side portion and a drain-side portion, wherein the gate-side portion extends between the gate terminal and a first intermediate position, and the drain-side portion extends between the drain terminal and a second intermediate position. In some aspects, the techniques described herein relate to a semiconductor device, wherein the gate-side portion and the drain-side portions each includes a plurality of segments. In some aspects, the techniques described herein relate to a semiconductor device, wherein the fourth semiconductor region is positioned between a top surface of the first semiconductor region and the third semiconductor region, wherein the net charge region has the net charge in the depletion region that is substantially equal to a sum of the net charge of the at least one two-dimensional channel in the first semiconductor region and a net charge of the fourth semiconductor region when the semiconductor device is in the off-state, and wherein the fourth semiconductor region is also positioned over the second semiconductor region.

In some aspects, the techniques described herein relate to a semiconductor device, wherein the net charge region and the underlying fourth semiconductor region include a plurality of segments. In some aspects, the techniques described herein relate to a semiconductor device, wherein the net charge region and the underlying fourth semiconductor region extend between the gate terminal and a first intermediate position between the gate terminal and the drain terminal. In some aspects, the techniques described herein relate to a semiconductor device, wherein the net charge region and the underlying fourth semiconductor region include a plurality of segments. In some aspects, the techniques described herein relate to a semiconductor device, wherein the net-charge region and the underlying fourth semiconductor region includes a gate-side portion and a drain-side portion, wherein the gate-side portion extends between the gate terminal and a first intermediate position, and the drain-side portion extends between the drain terminal and a second intermediate position.

In some aspects, the techniques described herein relate to a semiconductor device, wherein the gate-side portion and the drain-side portion each include a plurality of segments. In some aspects, the techniques described herein relate to a semiconductor device, wherein the gate region includes a plurality of sub-regions, any two sub-regions of the plurality of sub-regions separated by portions of the semiconductor region, and wherein the net charge region extends between the gate terminal and the drain terminal. In some aspects, the techniques described herein relate to a semiconductor device, wherein the net charge region includes a plurality of segments.

In some aspects, the techniques described herein relate to a semiconductor device, wherein the gate region includes a plurality of sub-regions, any two sub-regions of the plurality of sub-regions separated by portions of the semiconductor region, and wherein the net charge region extends between the gate terminal and an intermediate position between the gate terminal and the drain terminal. In some aspects, the techniques described herein relate to a semiconductor device, wherein the net charge region includes a plurality of segments. In some aspects, the techniques described herein relate to a semiconductor device, wherein the gate region includes a plurality of sub-regions, any two sub-regions of the plurality of sub-regions separated by portions of the semiconductor region, and wherein the net charge region includes a gate-side portion and a drain-side portion, wherein the gate-side portion extends between the gate terminal and a first intermediate position, and the drain-side portion extends between the drain terminal and a second intermediate position.

In some aspects, the techniques described herein relate to a semiconductor device, wherein the gate-side portion and the drain-side portion each includes a plurality of segments. In some aspects, the techniques described herein relate to a semiconductor device, wherein the gate region includes a plurality of sub-regions, any two sub-regions of the plurality of sub-regions separated by portions of the semiconductor region, the semiconductor device further including: a metal-oxide material disposed over sidewalls of the plurality of sub-regions; and wherein the net charge region extends between the gate terminal and the drain terminal. In some aspects, the techniques described herein relate to a semiconductor device, wherein the net charge region includes a plurality of segments. In some aspects, the techniques described herein relate to a semiconductor device, wherein the gate region includes a plurality of sub-regions, any two sub-regions of the plurality of sub-regions separated by portions of the semiconductor region, the semiconductor device further including: a metal-oxide material disposed over sidewalls of the plurality of sub-regions; and wherein the net charge region extends between the gate terminal and an intermediate position between the gate terminal and the drain terminal.

In some aspects, the techniques described herein relate to a semiconductor device, wherein the net charge region includes a plurality of segments. In some aspects, the techniques described herein relate to a semiconductor device, wherein the gate region includes a plurality of sub-regions, any two sub-regions of the plurality of sub-regions separated by portions of the semiconductor region, the semiconductor device further including: a metal-oxide material disposed over sidewalls of the plurality of sub-regions; and wherein the net charge region includes a gate-side portion and a drain-side portion, wherein the gate-side portion extends between the gate terminal and a first intermediate position, and the drain-side portion extends between the drain terminal and a second intermediate position. In some aspects, the techniques described herein relate to a semiconductor device, wherein each of the gate-side portion and the drain-side portion includes a plurality of segments.

BRIEF DESCRIPTION OF THE DRAWINGS

Like reference numbers and designations in the various drawings indicate like elements.

DETAILED DESCRIPTION

Figure 1A:
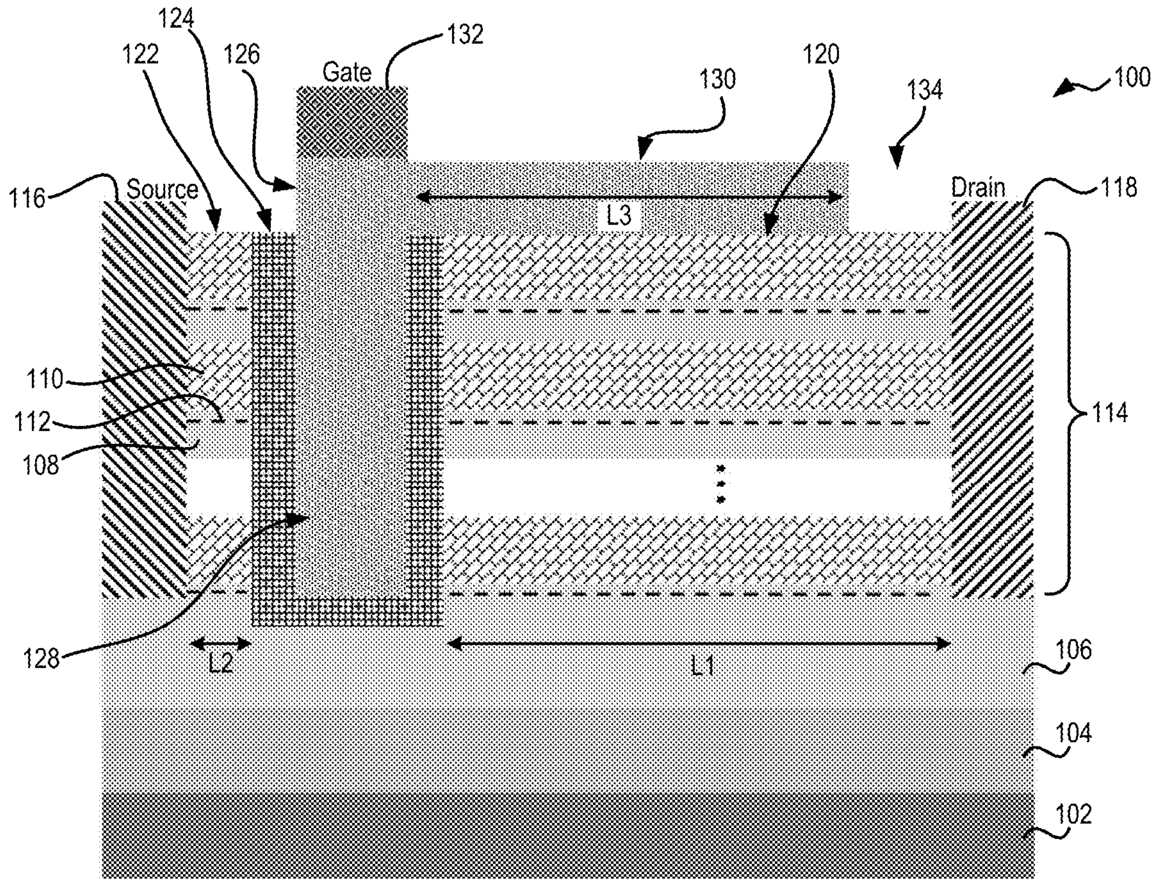
FIGS. 1A-1D show various views of a first example semiconductor device.

The various concepts introduced above and discussed in greater detail below may be implemented in any of numerous ways, as the described concepts are not limited to any particular manner of implementation. Examples of specific implementations and applications are provided primarily for illustrative purposes.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Prior to describing the various aspects of the present disclosure, the following definitions are provided and should be used unless otherwise indicated. Additional terms may be defined elsewhere in the present disclosure.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of" "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used herein, the term "and/or" includes any and all combinations of one or more of the associated listed items. Expressions such as "at least one of," when preceding a list of elements, modify the entire list of elements and do not modify the individual elements of the list.

As used in the specification and the appended claims, the singular forms "a," "an" and "the" include plural referents unless the context clearly dictates otherwise. Thus, for example, reference to "a proton beam degrader," "a degrader foil," or "a conduit," includes, but is not limited to, two or more such proton beam degraders, degrader foils, or conduits, and the like.

The various concepts introduced above and discussed in greater detail below may be implemented in any of numerous ways, as the described concepts are not limited to any particular manner of implementation. Examples of specific implementations and applications are provided primarily for illustrative purposes.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere).

Several transistors utilize two-dimensional carrier channels to carry current between the source and drain terminal, which current can be modulated by applying appropriate voltages to a gate terminal. Some of these transistors suffer from low breakdown voltages when the transistor is in the OFF state. The examples discussed herein provide transistors with improved breakdown voltage by utilizing net-charge balancing to reduce peak electrical fields within the device and to distribute the electric field strength more uniformly within the device. The uniform distribution of the electric field can help increase the breakdown voltage of the device when the device is in the OFF state.

Figure 1B:
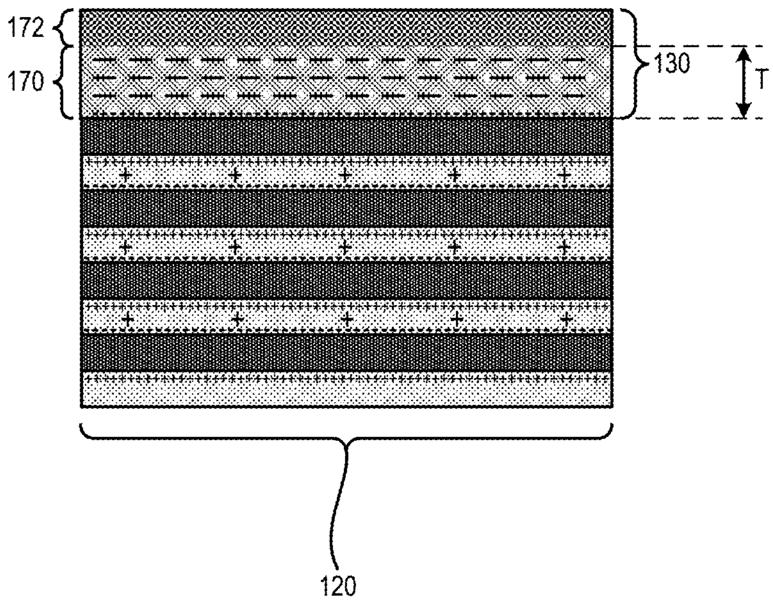
Figure 1C:
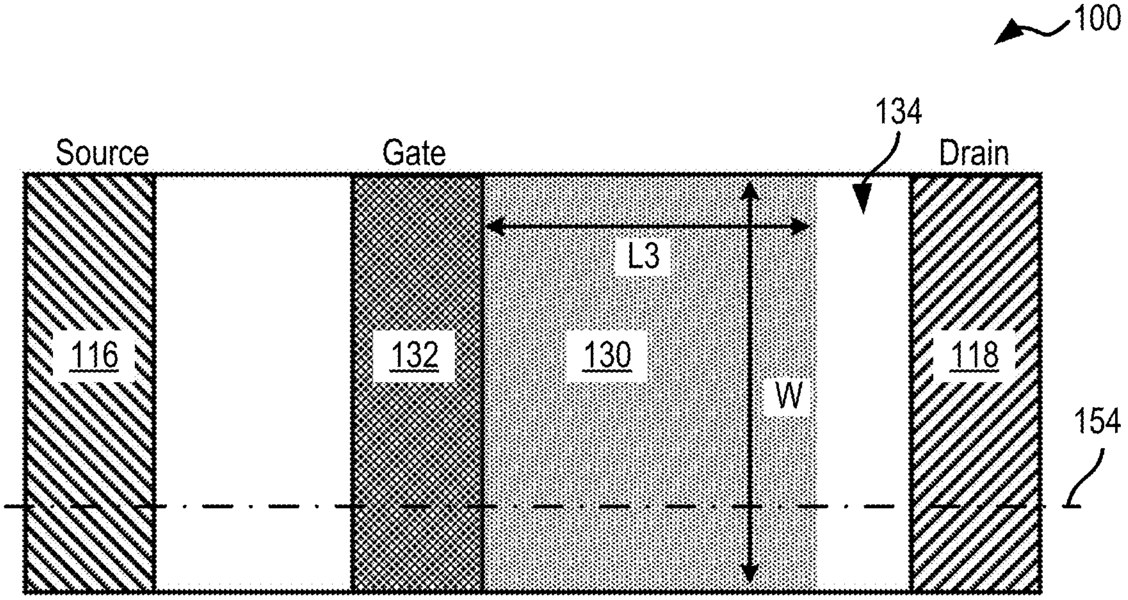
Figure 1D:
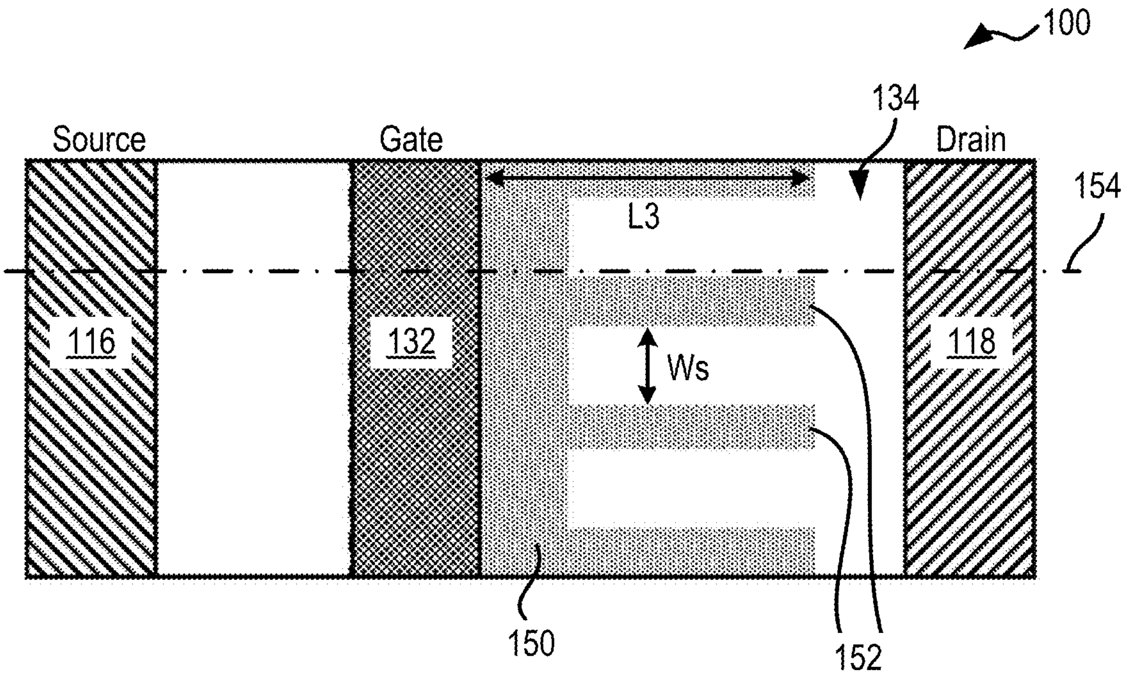

FIGS. 1A-1D shows various views of a first example semiconductor device 100. In particular, FIG. 1A shows a cross-sectional view of the first example semiconductor device 100, while FIGS. 1C and 1D show a top view of the first example semiconductor device 100 shown in FIG. 1A (some features are not shown for sake of clarity). The first example semiconductor device 100 includes a substrate 102, one or more transition layers 104 disposed over the substrate 102, and a gallium nitride layer (i-GaN layer 106) positioned over the one or more transition layers 104. The substrate 102 can include materials such as, for example, silicon, sapphire, diamond, silicon carbide (SiC), aluminum nitride (AlN), etc. The one or more transition layers 104 can include, for example, and without limitation, aluminum gallium nitride and aluminum nitride. The one or more transition layers 104 can adjust for coefficient of thermal expansion mismatch between the substrate 102 and the i-GaN layer 106, thereby improving the structural reliability of the first example semiconductor device 100.

A semiconductor region 114 can be formed over the i-GaN layer 106. The semiconductor region 114 can include alternating layers of aluminum gallium nitride (AlGaN layer 108) and GaN layer 110, also referred to as a AlGaN/GaN heterostructure. However, the semiconductor region 114 can include other nitride materials such as, for example, any one of the Group III-nitride materials. Spontaneous and strain induced polarization can lead to a high positive polarization in the AlGaN layer 108, resulting in at least one two-dimensional carrier channel 112. In some instances, the at least one two-dimensional carrier channel 112 can include at least one electron gas (2DEG) channel induced at the AlGaN/GaN interface. The 2DEG channels can extend laterally between a source terminal 116 and a drain terminal 118. The semiconductor region 114 can include one or more 2DEG channels. As each 2DEG channel is formed at an interface of a AlGaN layer and a GaN layer, multiple 2DEG channels can be formed by including multiple alternating AlGaN and GaN layers. In the example shown in FIG. 1A, the semiconductor region 114 can have a first conductivity type of n-type. However, in some other examples, the semiconductor region 114 can have a p-type conductivity type instead. In some such examples, the semiconductor region 114 can include two-dimensional hole gas (2DHG) channels instead of 2DEG channels. The at least one two-dimensional carrier channel 112 can be formed at the interface of materials other than AlGaN and GaN. For example, materials such as AlGaO/GaO or AlN/AlGaN also can be used to form the at least one two-dimensional carrier channel 112.

The semiconductor region 114 can include a first semiconductor region 120 and a second semiconductor region 122. The first semiconductor region 120 is coupled with the drain terminal 118 while the second semiconductor region 122 is coupled with the source terminal 116. The first semiconductor region 120 extends between the drain terminal 118 on one end and a portion of a fourth semiconductor region 124 on the other end. The second semiconductor region 122 extends between the source terminal 116 on one end and another portion of the fourth semiconductor region 124 on the other end. The first semiconductor region 120 and the second semiconductor region 122 are separated at least in part by the fourth semiconductor region 124. In some examples, both the first semiconductor region 120 and the second semiconductor region 122 can include the same number of two-dimensional carrier channels formed using the same number of alternating AlGaN/GaN layers. However, in some instances, the first semiconductor region 120 and the second semiconductor region 122 may include unequal number of two-dimensional carrier channels. In some examples, the AlGaN/GaN (or generally any of the Group III-nitride alternating layers) layers in each of the first semiconductor region 120 and the second semiconductor region 122 can have the same material and physical properties. In some such examples, the first semiconductor region 120 and the second semiconductor region 122 may be formed by depositing alternating layers of AlGaN/GaN to first form a continuous semiconductor region 114, and then etching a region along a width of the semiconductor region 114 to separate the first semiconductor region 120 and the second semiconductor region 122. The etched region can include the fourth semiconductor region 124, as shown in FIG. 1A. In the example shown in FIG. 1A, the first semiconductor region 120 can have a length L1 that can be defined by a distance between a sidewall coupled with the drain terminal 118 and a sidewall coupled with a portion of the fourth semiconductor region 124, while the second semiconductor region 122 can have a length L2 that can be defined by a distance between a sidewall of the second semiconductor region 122 coupled with the source terminal 116 and a sidewall coupled with another portion of the fourth semiconductor region 124. The length L1 of the first semiconductor region 120 can be greater than the length L2 of the second semiconductor region 122. In some other examples, the length L1 can be equal to or less than the length L2.

The fourth semiconductor region 124 include at least one portion that is disposed over a sidewall of the first semiconductor region 120 and another portion that is disposed over the sidewall of the second semiconductor region 122. In addition, the fourth semiconductor region 124 includes a portion that couples the portions disposed on the sidewalls of the first semiconductor region 120 and the second semiconductor region 122. For example, as shown in FIG. 1A, the fourth semiconductor region 124 forms a U-shaped structure with a bottom portion that is disposed over the i-GaN layer 106. The fourth semiconductor region 124 can extend along the sidewalls of the first semiconductor region 120 and the second semiconductor region 122 such as all of the at least one two-dimensional carrier channel 112 in each of the first semiconductor region 120 and the second semiconductor region 122 terminate into or make contact with the fourth semiconductor region 124. A portion of the fourth semiconductor region 124 can be positioned deeper into the i-GaN layer 106 than the interface between the i-GaN layer 106 and the bottommost AlGaN layer of the semiconductor region 114. The fourth semiconductor region 124 can be of the same conductivity type as the conductivity type of the at least one two-dimensional carrier channel 112. For example, if the at least one two-dimensional carrier channel 112 are of the n-type conductivity (i.e., 2DEGs), then the fourth semiconductor region 124 is also of the n-type conductivity. At least one example of the n-type fourth semiconductor region 124 can include n-GaN. Of course, if the conductivity type of the at least one two-dimensional carrier channel 112 were p-type, then the fourth semiconductor region 124 is also of the p-type conductivity. At least one example of the p-type fourth semiconductor region 124 can include p-GaN. In some examples, if the semiconductor region 114 includes alternating layers of AlGaO and GaO, then the fourth semiconductor region 124 can include n-GaO or p-GaO based on the conductivity type of the at least one two-dimensional carrier channel 112. If the semiconductor region 114. In some other examples, if the semiconductor region 114 includes alternating layers of aluminum nitride (AlN) and AlGaN, the fourth semiconductor region 124 can include n-AlGaN or p-AlGaN based on the conductivity type of the at least one two-dimensional carrier channel 112.

At least a portion of a third semiconductor region 126 is positioned between the first semiconductor region 120 and the second semiconductor region 122. In particular, the third semiconductor region 126 includes a gate region 128 and a net charge region 130, where the gate region 128 is disposed between the first semiconductor region 120 and the second semiconductor region 122, while the net charge region 130 is positioned over the first semiconductor region 120. The gate region 128 is positioned below and is coupled with a gate terminal 132. The gate region 128 is separated from the first semiconductor region 120, the second semiconductor region 122 and the i-GaN layer 106 by the fourth semiconductor region 124. The net charge region 130 extends over the first semiconductor region 120 between the gate terminal 132 and the drain terminal 118. In the example shown in FIG. 1A, the net charge region 130 does not fully extend between the gate terminal 132 and the drain terminal 118. That is, the net charge region 130 does not make contact with the 118—defining a gap 134 between the net charge region 130 and the drain terminal 118.

The third semiconductor region 126 has a conductivity type that is opposite to that of the fourth semiconductor region 124 and the at least one two-dimensional carrier channel 112. For example, if n-type (p-type) is the conductivity type of the fourth semiconductor region 124 and the at least one two-dimensional carrier channel 112, then the third semiconductor region 126 is of the p-type (n-type) conductivity.

The net charge region 130 can have a net charge in a depletion region that is substantially equal to the net charge of the at least one two-dimensional carrier channel 112 in the first semiconductor region 120 when the first example semiconductor device 100 is in the off state. FIG. 1B shows a cross-sectional view of the depletion charge distribution of a portion of the first example semiconductor device 100 shown in FIG. 1A. In particular, FIG. 1B shows the first semiconductor region 120 and the net charge region 130 under off state conditions. The first example semiconductor device 100 can be in an off state when the voltage difference between at the gate terminal 132 and the source terminal 116 is less than a threshold voltage of the first example semiconductor device 100. The at least one two-dimensional carrier channel 112 can have a net charge. In instances of where the at least one two-dimensional carrier channel 112 includes 2DEG channels, the net charge can be a positive, while in instances where the at least one two-dimensional carrier channel 112 includes 2DHG channels, the net charge can be negative. In particular, net donors provide electrons in the 2DEG channels, which electrons are depleted under the off state leaving behind positive net charges. Similarly, net acceptors provide the holes in the 2DHG channels, which holes are depleted in the off state leaving behind negative net charges. The net charge of the first semiconductor region 120 can be a sum of the net charges of each of the at least one two-dimensional carrier channel 110. For example, where the first semiconductor region 120 include four 2DEG channels, the net charge of the first semiconductor region 120 can be equal to the sum of the net charge of each of the four 2DEG channels.

The net charge of the net charge region 130 can be equal to the acceptor concentration in the depletion region of the net charge region 130 times the area of the net charge region 130 times the thickness T of the depletion region in the net charge region 130. The area of the net charge region 130 can be the product of a width and the length of the net charge region 130 over the first semiconductor region 120 in a plane that is normal to the plane in which the thickness T is measured. For example, referring to FIG. 1A, the area of the net charge region 130 can be measured as a product of the length L3 times a width that is in a dimension normal to the page. The net charge region 130 (and the third semiconductor region 126) in the first example semiconductor device 100 shown in FIG. 1 is a p-type material. In such examples, the net charge region 130 (and the third semiconductor region 126) is doped with acceptor material such as, for example, magnesium, zinc, cadmium, etc. In instances, where the net charge region 130 is n-type, the net charge region 130 can be doped with donor materials such as, for example, substitutional silicon, substitutional germanium, substitutional oxygen, etc. In such examples, the net charge of net charge region 130 would be determined based on the donor concentration instead of the acceptor concentration mentioned above in relation to the p-type net charge region 130.

Under the OFF state of the first example semiconductor device 100, that is, when the difference between the voltage at the gate terminal 132 and the voltage at the source terminal 116 is less than a threshold voltage of the first example semiconductor device 100, and when the voltage at the drain terminal 118 is at a considerably higher (e.g., 10 V to about 100 V or higher) than that when the first example semiconductor device 100 is in in the ON state with forward conduction, the net charge at the depletion region 170 of the net charge region 130 can be substantially equal to the net charge at first semiconductor region 120. In particular, referring again to FIG. 1B, the net charge region 130 includes a depletion region 170 and a non-depletion region 172 in the OFF state. The depletion region 170 includes negative acceptor ions. Similarly, positive donor ions are left behind in the first semiconductor region 120. The depletion region 170 can extend along the length L3 of the net charge region 130. The negative acceptor ions in the depletion region 170 are substantially equal to the positive donor ions in the first semiconductor region 120. As referred to herein, substantially equal means that the net charges are within ±30% of each other. For example, the net charge of the first semiconductor region 120 can be considered substantially equal to the net charge of the net charge region 130 if the value of the net charge of the first semiconductor region 120 is within a range of 0.7 times to 1.3 times the net charge of the net charge region 130 within the depletion region 170. Similarly, the net charge of the net charge region 130 within the depletion region 170 can be considered substantially equal to the net charge of the first semiconductor region 120 if the value of the net charge of the net charge region 130 within the depletion region 170 is within a range of 0.7 times to 1.3 times the value of the net charge of the first semiconductor region 120. In some examples, the substantially equal means that the net charges are within ±20% of each other. In some examples, substantially equal means that the net charges are within ±10% of each other. In some examples, substantially equal means that the net charges are within ±5% of each other.

It should be noted that the thickness T of the depletion region 170 can vary based on the magnitude of the OFF state voltage measured between the drain terminal 118 and the source terminal 116 (VDs). That is, the thickness T of the depletion region 170 increases with an increase in the OFF state voltage VDS. In some instances, where the OFF state voltage is high enough that the depletion region 170 extends the entire thickness of the net charge region 130, the thickness T can be the thickness of the net charge region 130.

In some examples, the net charge region 130 can be uniformly doped. That is, the dopant concentration is uniform across the thickness T of the net charge region 130. However, in some instances, the doping concentration may be non-uniform. For example, in some instances, the net charge region 130 can be doped in a graded configuration. In a graded configuration, the doping concentration can increase or decrease incrementally as a function of the distance from the top or the bottom of the net charge region 130. In some examples, the rate of increase in the doping concentration can be linear. In some other examples, the rate of increase in the doping concentration can be non-linear such as, for example, exponential, square of the distance, or some other non-linear function. In some examples, the net charge region 130 can be doped in a bulk configuration, which includes doping in a three-dimensional configuration and is in contrast with delta doping, which results in a narrow doping profile.

Having the net charge in the depletion region 170 of the net charge region 130 substantially equal to the net charge of the at least one two-dimensional carrier channel 112 in the first semiconductor region 120 can result in uniform electrical field distribution across the first semiconductor region 120 when the first example semiconductor device 100 is in the OFF state. The uniform electrical field distribution means that the risk of formation of peak electrical fields, which otherwise could limit the reverse breakdown voltage of the first example semiconductor device 100, is reduced. Therefore, the net charge balance can improve the breakdown voltage of the first example semiconductor device 100.

FIG. 1C shows a top view of a portion of the first example semiconductor device 100 shown in FIG. 1A. The top view more clearly shows the extent to which the net charge region 130 extends between the gate terminal 132 and the drain terminal 118. The net charge region 130 extends for a length L3 from the gate terminal 132, and the net charge region 130 is separated from the drain terminal 118 by the gap 134. The net charge region 130 also has a width W, which in the example shown in FIG. 1C extends the entire width of the first example semiconductor device 100. In some examples, the width W of the net charge region 130 can be less than the width of the first example semiconductor device 100.

FIG. 1D shows a top view of a portion of the first example semiconductor device with a segmented net charge region 150. The segmented net charge region 150 includes a plurality of segments 152 that extend between the gate terminal 132 and the drain terminal 118. The plurality of segments 152 are separated by gaps with width denoted by Ws. In the example shown in FIG. 1D, the plurality of segments 152 evenly separated by a gap Ws. In some other implementations, the plurality of segments 152 may be unevenly separated. Each segment in the plurality of segments 152 extends parallel to a longitudinal axis 154 that extends between the drain terminal 118 and the source terminal 116 of the first example semiconductor device 100. In some instances, at least one of the segments of the plurality of segments 152 can form a non-zero angle with the longitudinal axis 154. In the example shown in FIG. 1D, each segment of the plurality of segments 152 is linear in shape. That is, the segments appear as linear fins that extend between the gate terminal 132 and the drain terminal 118. Alternatively, at least one segment of the plurality of segments 152 can have a non-linear shape such as, for example, a curved shape. In some implementations, a length of at least one segment (measured along the longitudinal axis 154) can be different from the length of at least one other segment of the plurality of segments 152.

As mentioned above, the net charge region 130 is charge balanced in relation to the at least one two-dimensional carrier channel 112 in the first semiconductor region 120. In a similar manner, the segmented net charge region 150 is also charge balanced in relation to the first semiconductor region 120. It should be noted that the surface area of the segmented net charge region 150 is less than the surface area of the net charge region 130 shown in FIG. 1C. As a result, the doping concentration of the segmented net charge region 150 would have to be increased to maintain the charge balance with the first semiconductor region 120. It should be noted that the segmented net charge region 150 does not merely maintain charge balance with the portions of the first semiconductor region 120 directly under the segmented net charge region 150. Instead, the segmented net charge region 150 is configured to maintain charge balance with the entire width W and length of the first semiconductor region 120.

Having a segmented net charge region 150 may result in a relatively less uniform electrical field distribution compared to that of the net charge region 130 shown in FIG. 1C. This may result in a relatively lower breakdown voltage for the first example semiconductor device 100 with the segmented net charge region 150. However, the ON resistance of the first example semiconductor device 100 with the segmented net charge region 150 can be less than that of the first example semiconductor device 100 with the unsegmented net charge region 130. The presence of the net charge region 130 over the first semiconductor region 120 may cause a reduction in the density of the at least one two-dimensional carrier channel 112 that are positioned close to the net charge region 130. This reduction in the density of the at least one two-dimensional carrier channel 112 may increase the ON resistance of the first example semiconductor device 100. By segmenting the net charge region in the manner described above in relation to FIG. 1D, the effect on the density of the at least one two-dimensional carrier channel 112 is reduced, thereby reducing the risk of high ON resistance.

Referring again to FIG. 1A, the first example semiconductor device 100 can operate in an OFF state when the difference in the voltages at the gate terminal 132 and the source terminal 116 is less than the threshold voltage associated with the first example semiconductor device 100. The gate region 128 of the third semiconductor region 126 and the fourth semiconductor region 124 are of the opposite conductivity type. As a result, the gate region 128 and the fourth semiconductor region 124 will form respective depletion regions near their interface. The relative doping of the gate region 128 and the fourth semiconductor region 124 can be selected such that in the OFF state, the depletion region in the fourth semiconductor region 124 extends through the entire thickness of the fourth semiconductor region 124. This means that the fourth semiconductor region 124 is devoid of carriers, thereby providing no conduction path between the carriers in the second semiconductor region 122, which is coupled with the source terminal 116, and the first semiconductor region 120, which is coupled with the drain terminal 118. Thus, no current can flow between the source terminal 116 and the drain terminal 118 of the first example semiconductor device 100. As the voltage on the gate terminal 132 increases, the depletion region within the fourth semiconductor region 124 can recede up until when the voltage difference between the gate terminal 132 and the source terminal 116 is greater than the threshold voltage of the first example semiconductor device 100, at which point the thickness of the depletion region in the fourth semiconductor region 124 becomes less than the thickness of the fourth semiconductor region 124 itself. As a result, the fourth semiconductor region 124 now includes carriers that can conduct current between the first semiconductor region 120 and the second semiconductor region 122. This is the ON state of the first example semiconductor device 100.

Figure 2A:
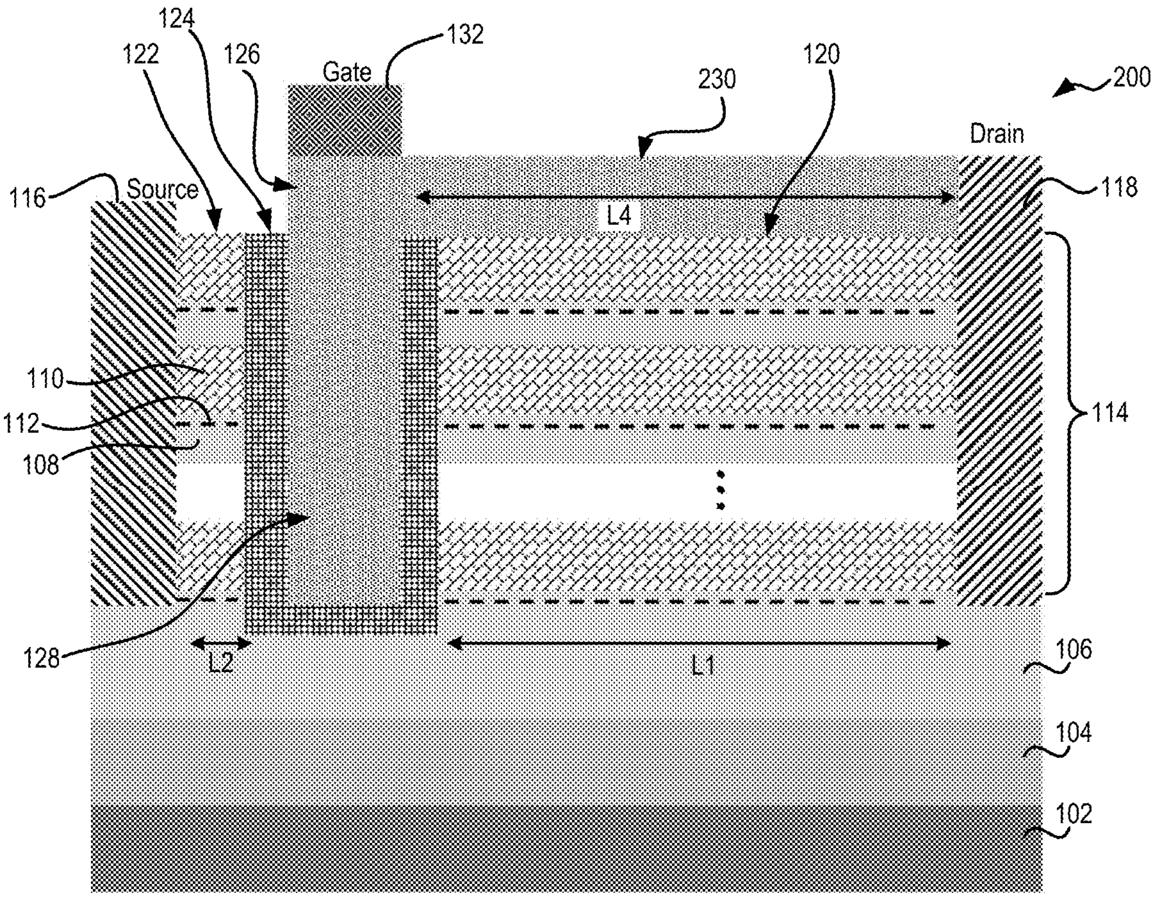
FIGS. 2A-2C show various views of a second example semiconductor device.
Figure 2B:
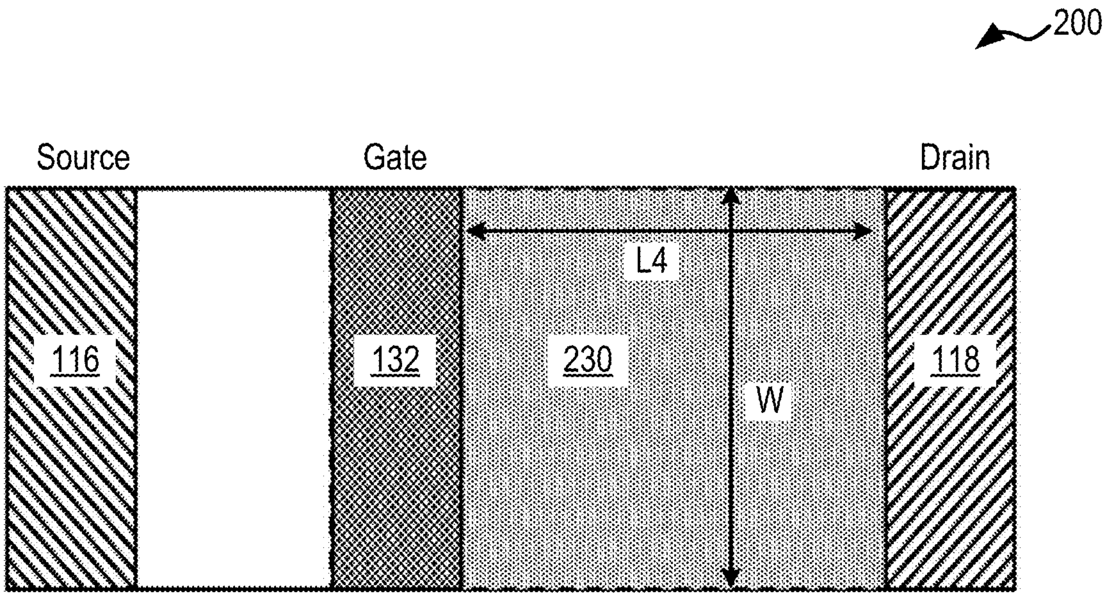

FIG. 2A shows a second example semiconductor device 200. The second example semiconductor device 200 is similar in many respects to the first example semiconductor device 100 shown in FIG. 1A. However, unlike the first example semiconductor device 100 where the net charge region 130 does not entirely extend between the gate terminal 132 and the drain terminal 118, the net charge region 230 of the second example semiconductor device 200 does extend between and is coupled with the gate terminal 132 and the drain terminal 118. The net charge region 230 has a length L4, which is the distance between the gate terminal 132 and the drain terminal 118. In this example, the net charge region 230 covers the entire length of the first semiconductor region 120. FIG. 2B shows a top view of the second example semiconductor device 200 shown in FIG. 2A. As shown in FIG. 2A, the net charge region 230 is coupled with both the gate terminal 132 and the drain terminal 118. The net charge region 230, like the net charge region 130 of the first example semiconductor device 100 shown in FIG. 1A, can have a net charge that balances the net charge in the underlying first semiconductor region 120 in the OFF state of the second example semiconductor device 200.

Having the net charge region 230 extend through the entire length L4 between the gate terminal 132 and the drain terminal 118 can have the advantage of improving the uniformity of the electric field distribution between the gate terminal 132 and the drain terminal 118. This improvement in the uniformity of the electric field distribution can increase the breakdown voltage of the second example semiconductor device 200.

Figure 2C:
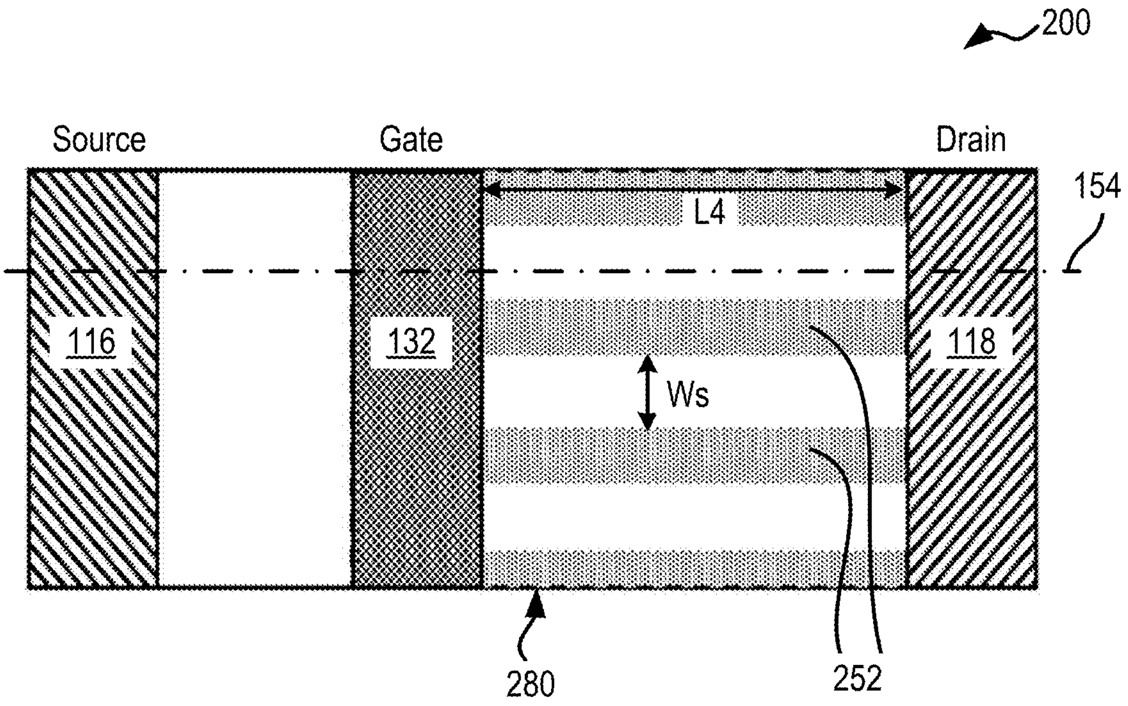

FIG. 2C shows a top view of the second example semiconductor device 200 including a segmented net charge region 280. The segmented net charge region 280 can be similar to the segmented net charge region 150 discussed above in relation to FIG. 1D. However, unlike the segmented net charge region 150, which did not extend to and was coupled with the drain terminal 118, the segmented net charge region 280 extends between and is coupled with both the gate terminal 132 and the drain terminal 118. The segmented net charge region 280 can include a plurality of segments 252, which can be similar to the plurality of segments 152 discussed above in relation to FIG. 1D, except that the plurality of segments 252 are coupled with both the gate terminal 132 and the drain terminal 118.

Figure 3A:
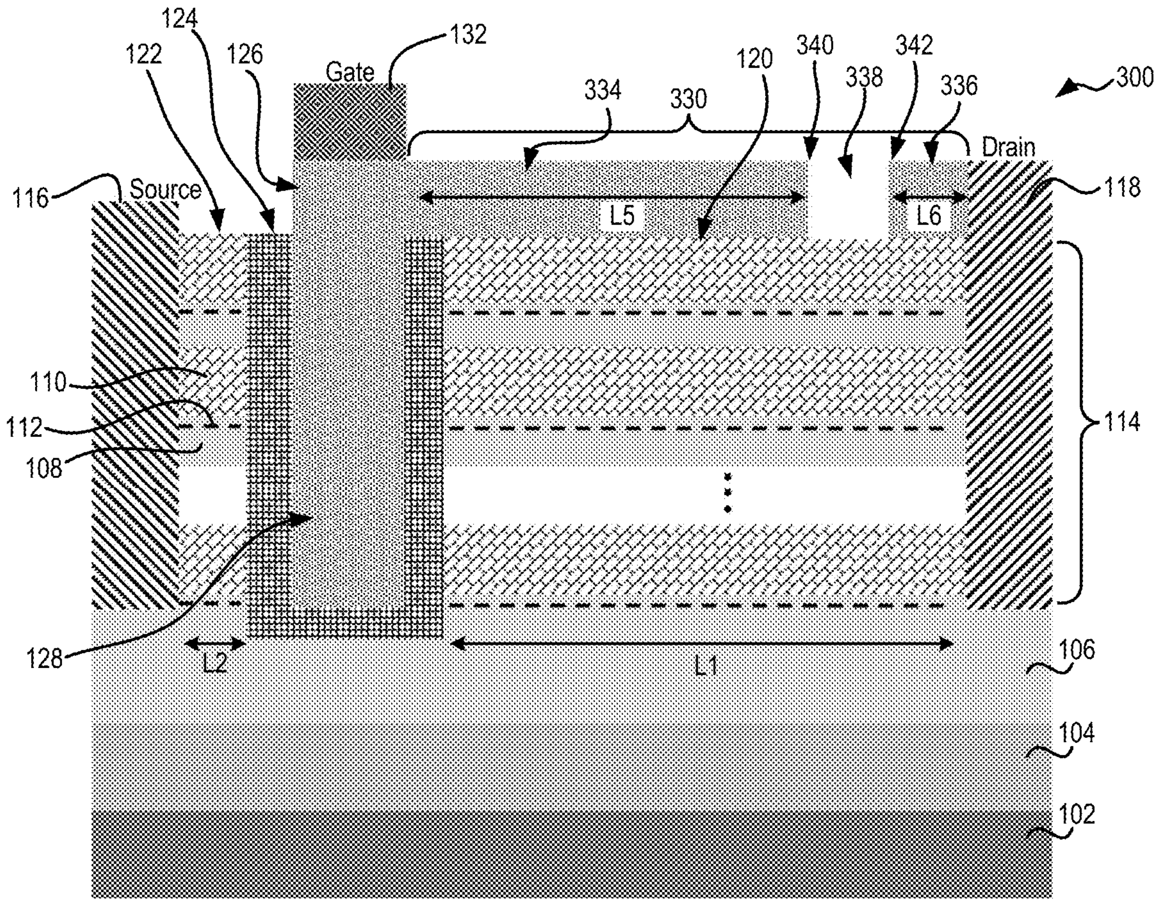
FIGS. 3A-3C show various views of a third example semiconductor device.

FIG. 3A shows a third example semiconductor device 300. The third example semiconductor device 300 is similar to the first example semiconductor device 100 and the second example semiconductor device 200 discussed above in relation to FIGS. 1A and 2A. However, the third example semiconductor device 300 includes a net charge region 330, which includes a gate-side portion 334 and a drain-side portion 336. The gate side portion 334 is coupled with the gate terminal 132 while the drain-side portion 336 is coupled with the drain terminal 118. The gate-side portion 334 and the drain-side portion 336 do not make contact and are separated by a gap 338. The gate-side portion 334 extends between the gate terminal 132 and a first intermediate position 340 (length L5 from the gate terminal 132), while the drain-side portion 336 extends between the drain terminal 118 and a second intermediate position 342 (length L6 form the drain terminal 118). The length L5 of the gate-side portion 334 can be greater than the length L6 of the drain-side portion 336. However, in some other examples, the lengths L5 and L6 can be equal or the length L6 can be greater than the length L5.

The inclusion of the drain-side portion 336 can improve the reliability and stability of the third example semiconductor device 300. In particular, the inclusion of the drain-side portion 336 coupled with the drain terminal 118 can inject carriers into the third example semiconductor device 300. The carriers can be holes if the conductivity type of the drain-side portion 336 is p-type and the carriers can be electrons if the conductivity type of the drain-side portion 336 is n-type. Assuming, for example, that the first semiconductor region 120 is n-type, the first semiconductor region 120 can include trapped electrons caused, in part, by impurities in the first semiconductor region 120. The injection of holes by the drain-side portion 336 of the net charge region 330 can help de-trap some of the trapped electrons.

Figure 3B:
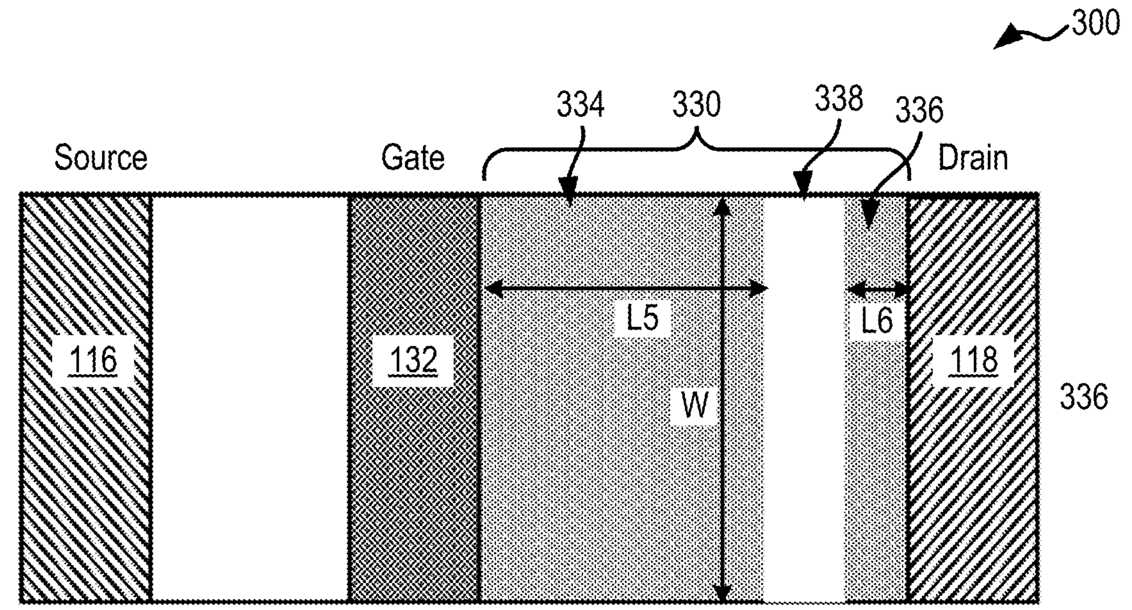

FIG. 3B shows a top view of the third example semiconductor device 300 shown in FIG. 3A. The gate-side portion 334 and the drain-side portion 336 of the net charge region 330 can have a width W that is equal to the width of the device third example semiconductor device 300. In some instances, the width W of the net charge region 330 can be less than the width of the third example semiconductor device 300. In the example shown in FIG. 3B, the width of the gate-side portion 334 and the width of the 336 are equal. In some other examples, the widths of the gate-side portion 334 and the drain-side portion 336 may be unequal. The net charge region 330, including the gate-side portion 334 and the drain-side portion 336, has a net charge balance with the underlying first semiconductor region 120 during the OFF state of the third example semiconductor device 300. Even though the total surface area of the gate-side portion 334 and the drain-side portion 336 is less than the surface area of the underlying first semiconductor region 120, the net charge region 330 is doped in a manner to balance the net charge.

Figure 3C:
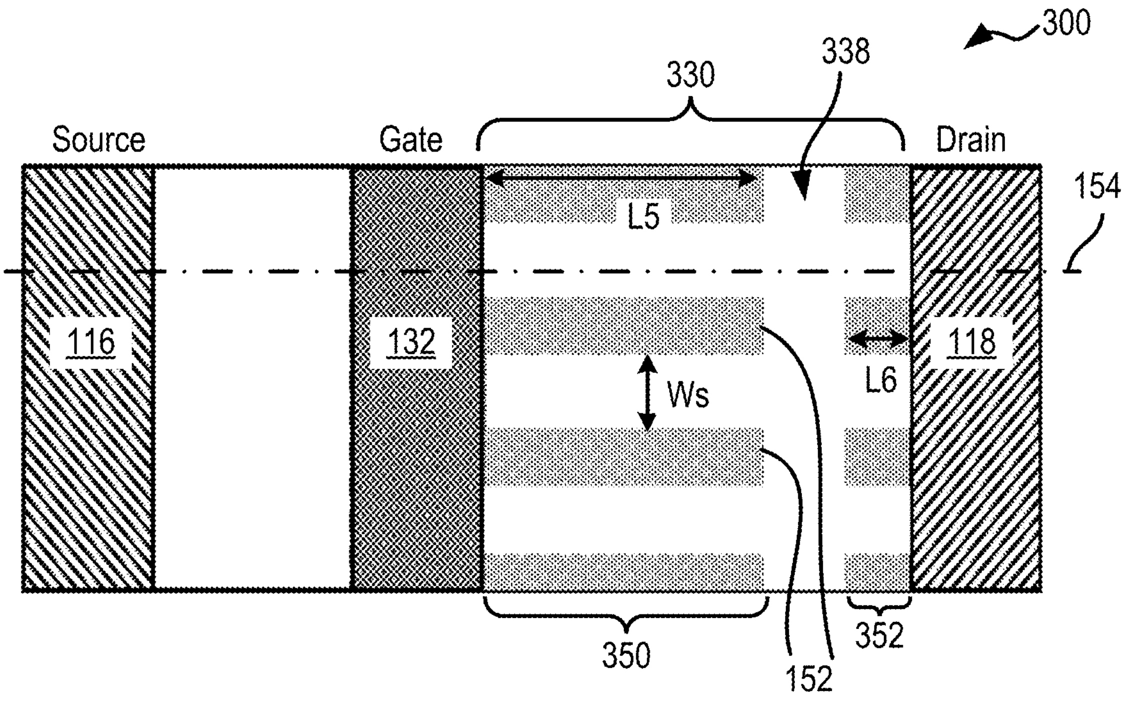

FIG. 3C shows a top view of the third example semiconductor device 300 having a segmented net charge region 330. In particular, the third example semiconductor device 300 includes a segmented gate-side portion 350 and a segmented drain-side portion 352. The segmented gate-side portion 350 and the segmented drain-side portion 352 can be similar to the segmented net charge region 150 and the segmented net charge region 280 discussed above in relation to FIGS. 1D and 2C. In particular, the segmented gate-side portion 350 can include various structural features discussed above in relation to the segmented net charge region 150 and the segmented net charge region 280. In some examples, the number of segments 152 or fins in the segmented gate-side portion 350 can be equal to the number of segments in the segmented drain-side portion 352. In some other examples, the number of segments in the segmented gate-side portion 350 can be different from the number of segments in the segmented drain-side portion 352. In some examples, the separation Ws between the segments in segmented gate-side portion 350 can be the same as the separation between the segments in the segmented drain-side portion 352. In some other examples, the separation between the segments in the segmented gate-side portion 350 can be different from the separation between the segments in the segmented drain-side portion 352.

Figure 4A:
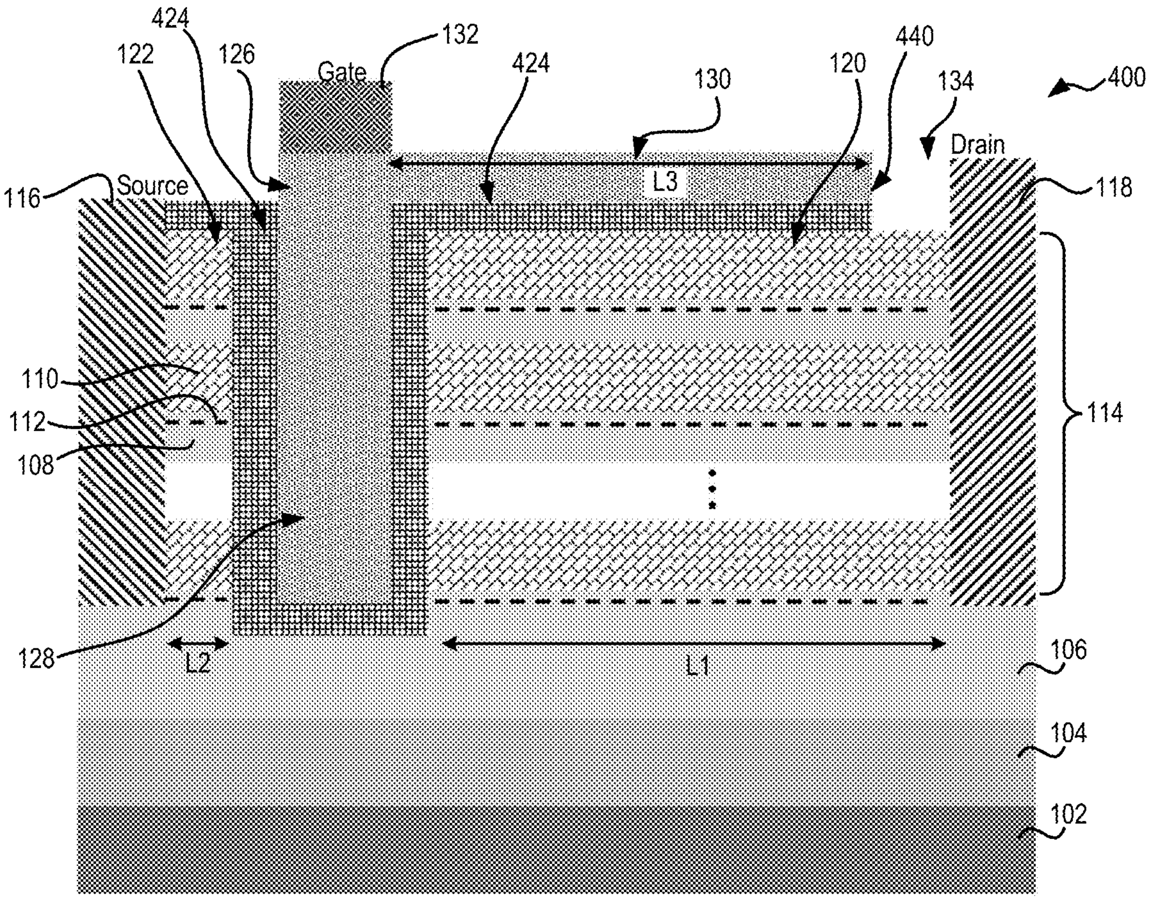
FIGS. 4A-4C show various views of a fourth example semiconductor device.

FIG. 4A shows a fourth example semiconductor device 400. The fourth example semiconductor device 400 is similar to the first example semiconductor device 100 discussed above in relation to FIGS. 1A-1D. But the fourth example semiconductor device 400 includes a fourth semiconductor region 424 that is not only positioned between the sidewalls of the second semiconductor region 122 and the gate region 128 and the sidewalls of the first semiconductor region 120 and the gate region 128 but also between the top surface of the first semiconductor region 120 and the net charge region 130 of the third semiconductor region 126. In addition, the fourth semiconductor region 424 is also disposed over the top surface of the second semiconductor region 122. The net charge region 130 and the underlying fourth semiconductor region 424 extend between the gate terminal 132 and a first intermediate position 440 between the gate terminal 132 and the drain terminal 118. To maintain charge balance, the net charge of the net charge region 130 is substantially equal to the sum of the net charges of the portion of the fourth semiconductor region 424 below the net charge region 130 and the net charge of the at least one two-dimensional carrier channel 112 in the first semiconductor region 120.

Including the fourth semiconductor region 424 makes the fabrication process relatively simpler. For example, during fabrication, a trench is etched within the semiconductor region 114 to separate the semiconductor region 114 into the first semiconductor region 120 and the second semiconductor region 122. Then a p-n junction is grown into the trench such that the p-n junction covers the sidewalls in the trench and the top surfaces of the first semiconductor region 120 and the second semiconductor region 122. Subsequently, the third semiconductor region 126 over the second semiconductor region 122 can be etched to leave behind only fourth semiconductor region 424. In contrast, fabricating the first example semiconductor device 100 shown in FIG. 1A would need the deposition of the fourth semiconductor region 124 and the gate region 128 separately with patterning and etching steps associated with each layer, thereby including additional fabrication steps relative to the fabrication of the fourth example semiconductor device 400.

Figure 4B:
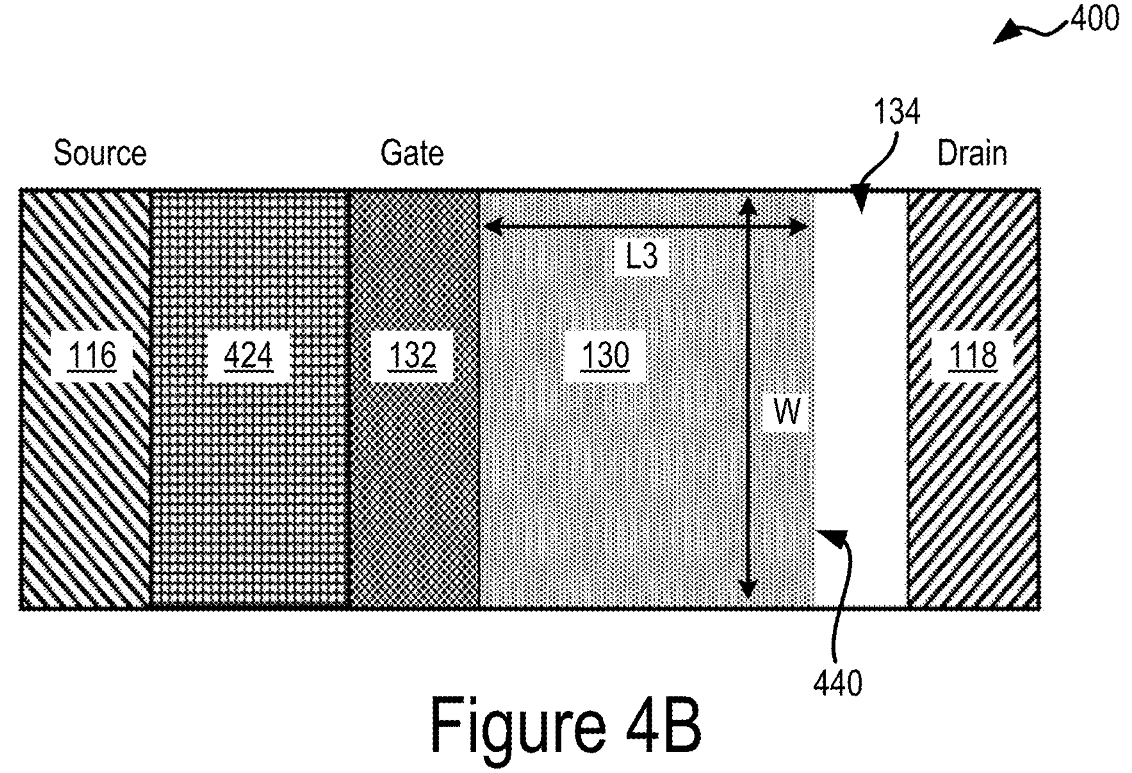

FIG. 4B shows a top view of the fourth example semiconductor device 400 shown in FIG. 4A. A portion of the fourth semiconductor region 424 disposed over the second semiconductor region 122 extends to the source terminal 116. The net charge region 130, which is disposed over the fourth semiconductor region 424 extends between the gate terminal 132 and the first intermediate position 440 for a length L3 and has a width W. While not visible in FIG. 4B, the fourth semiconductor region 424 also extends up to the first intermediate position 440 and has a width W. In some examples, the perimeter of the fourth semiconductor region 424 can be different from the perimeter of the net charge region 130. For example, the fourth semiconductor region 424 may extend further than the first intermediate position 440 to which the net charge region 130 extends. In some examples, the width of the net charge region 130 can be less than the width of the fourth semiconductor region 424.

Figure 4C:
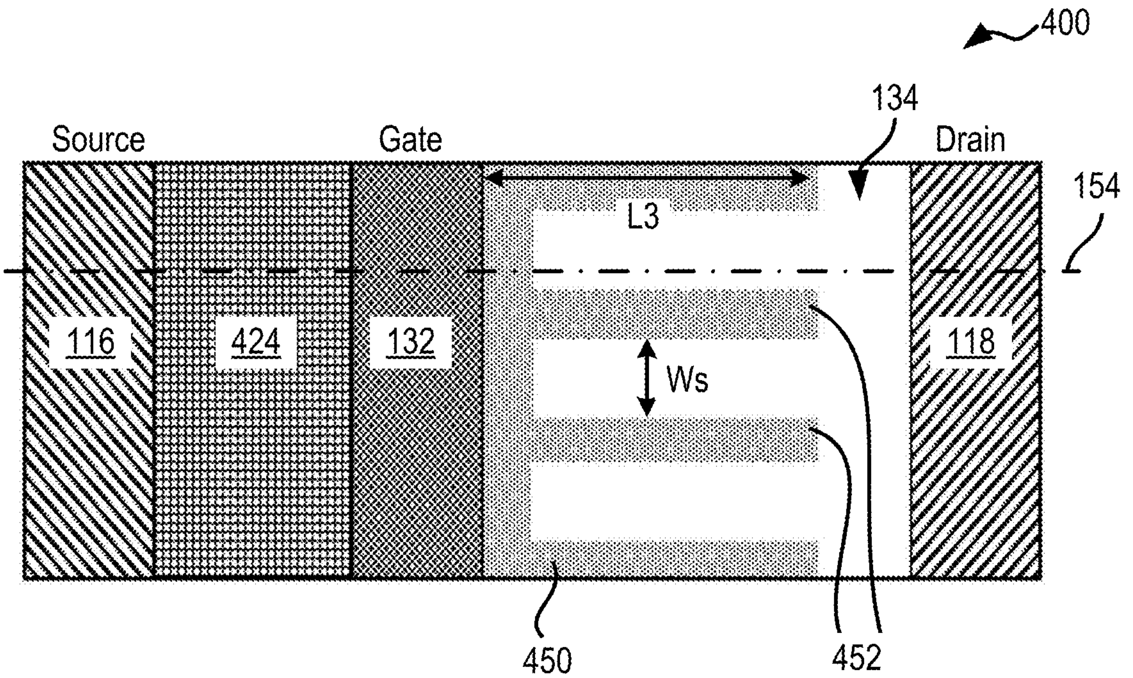

FIG. 4C shows a top view of the fourth example semiconductor device 400 with a segmented net charge region 450. The segmented net charge region 450 can be similar to the segmented net charge region 150 discussed above in relation to FIG. 1D and can include a plurality of segments 452. In particular, the segmented gate-side portion 350 can include various features discussed above in relation to the segmented net charge region 150. While not visible in FIG. 1D, the underlying portion of the 424 also has the same perimeter as the segmented net charge region 450 and includes a plurality of segments of the same dimensions as the segments 452. For example, the portion of the fourth semiconductor region 424 positioned between the segmented net charge region 450 and the first semiconductor region 120 can be patterned to have the same perimeter as the segmented net charge region 450. In some examples, the underlying portion of the fourth semiconductor region 424 can have a perimeter that is different from the perimeter of the segmented net charge region 450. For example, the portion of the 424 disposed between the first semiconductor region 120 and the segmented net charge region 450 can have a larger surface area than that of the segmented net charge region 450. The segmented net charge region 450 can be configured, taking into account the surface area and thickness of the underlying portion of the fourth semiconductor region 424, to balance the net charge of the segmented net charge region 450 with the sum of the net charge of the underlying portion of the fourth semiconductor region 424 and the net charge of the carrier channels in the first semiconductor region 120.

Figure 5A:
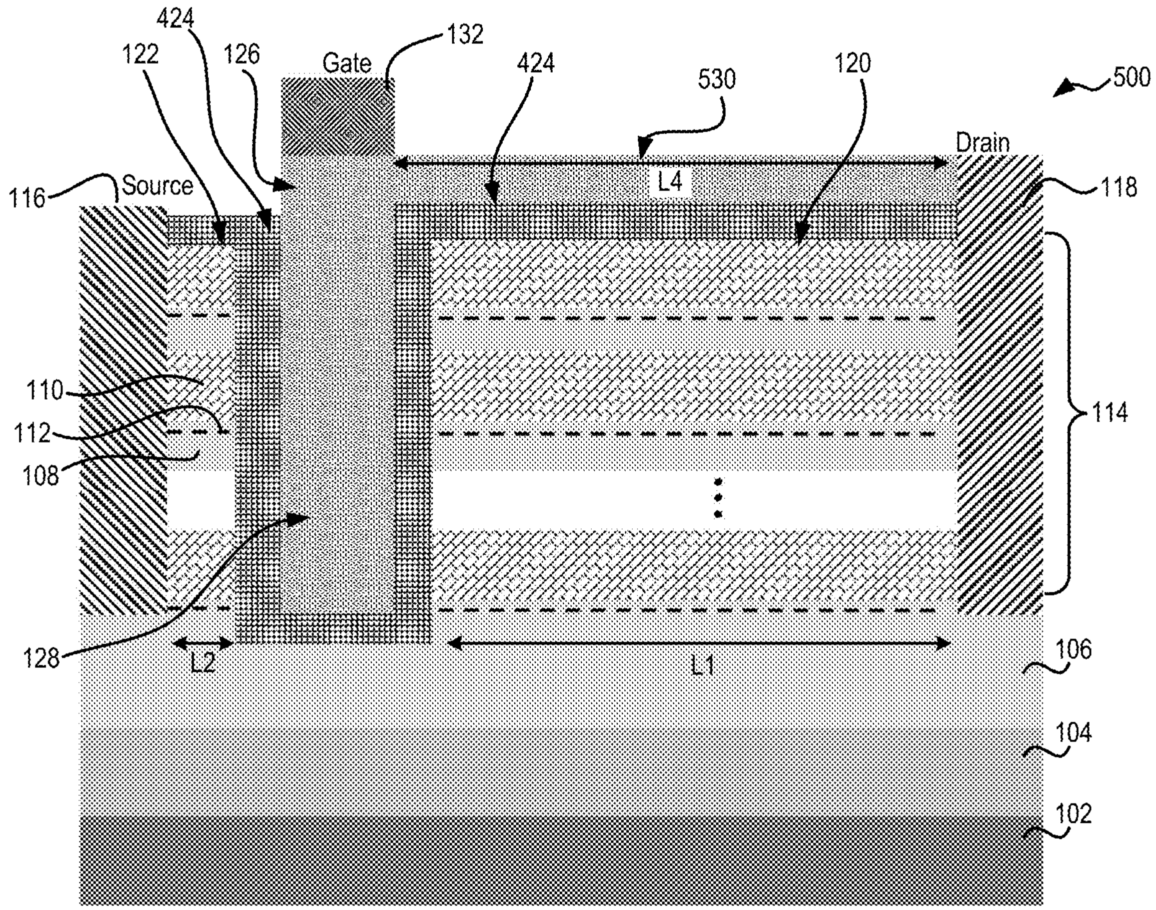
FIGS. 5A-5C show various views of a fifth example semiconductor device.

FIG. 5A shows a fifth example semiconductor device 500. The fifth example semiconductor device 500 is similar to the fourth example semiconductor device 400 discussed above in relation to FIG. 4A in that the fourth semiconductor region 424 is disposed between the net charge region 530 and the first semiconductor region 120. In particular, the fourth semiconductor region 424 can include various features discussed above in relation to the fourth semiconductor region 424 discussed above in relation to the fourth example semiconductor device 400. The fifth example semiconductor device 500 is also similar to the second example semiconductor device 200 discussed above in relation to FIGS. 2A-2B in that the net charge region 530 extends between and makes contact with both the gate terminal 132 and the drain terminal 118. In particular, the net charge region 530 can include the features discussed above in relation to the net charge region 230 of second example semiconductor device 200. The fifth example semiconductor device 500 in addition includes the portion of the fourth semiconductor region 424 disposed between the net charge region 530 and the first semiconductor region 120 also extends between and makes contact with both the gate terminal 132 and the drain terminal 118. The net charge region 530 and the portion of the fourth semiconductor region 424 positioned below the net charge region 530 have a length L4 that denotes the distance between the gate terminal 132 and the drain terminal 118.

Figure 5B:
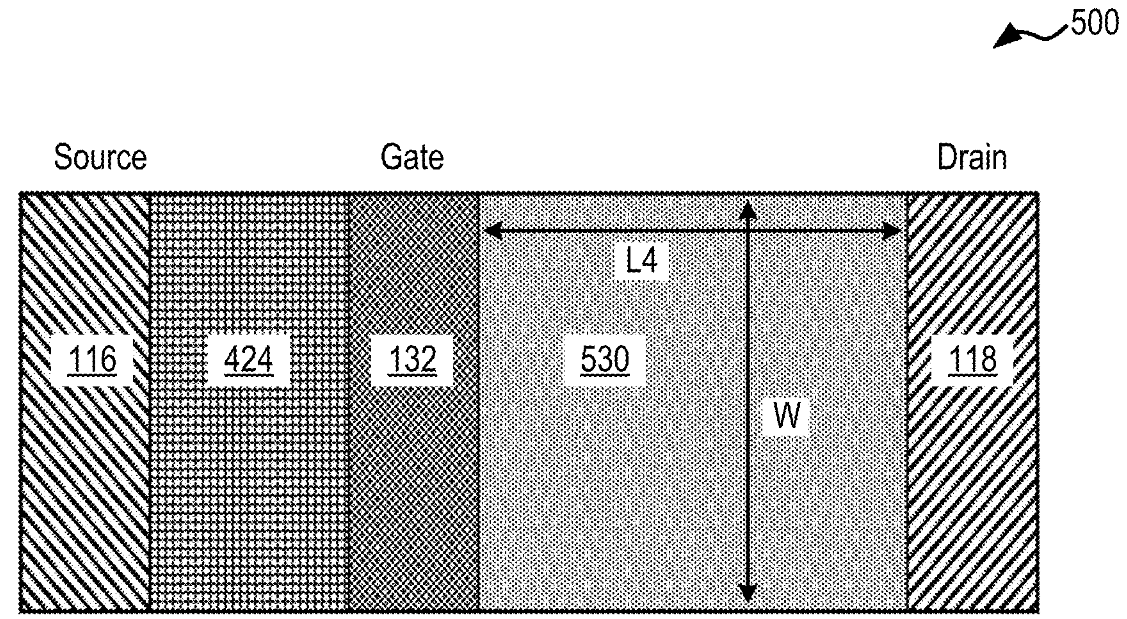

FIG. 5B shows a top view of the fifth example semiconductor device 500 discussed above in relation to FIG. 5A. The portion of fourth semiconductor region 424 over the second semiconductor region 122 can be seen in FIG. 5B extending to the source terminal 116. The net charge region 530 extends between and is coupled with both the gate terminal 132 and the drain terminal 118. The portion of the fourth semiconductor region 424 underlying the net charge region 530 also extends between and is coupled with both the gate terminal 132 and the drain terminal 118. As discussed above in relation to FIG. 2B, having the net charge region 530 extend between and couple with the gate terminal 132 and the drain terminal 118 can contribute to the uniformity of the electric field distribution along the length of the fifth example semiconductor device 500.

Figure 5C:
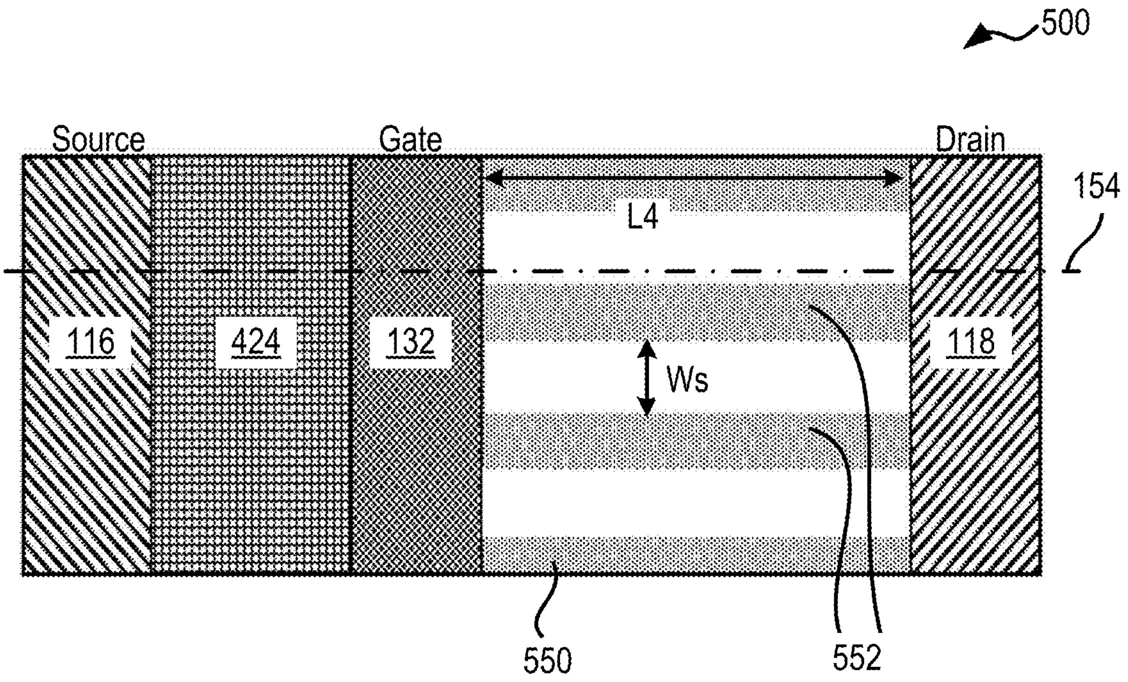

FIG. 5C shows a top view of the fifth example semiconductor device 500 having a segmented net charge region 550. The segmented net charge region 550 is similar to the segmented net charge region 280 discussed above in relation to FIG. 2C in that the segmented net charge region 550 includes segments 552 that extend between and are coupled with both the gate terminal 132 and the drain terminal 118. In addition, the portion of the fourth semiconductor region 424 between the segmented net charge region 550 and the first semiconductor region 120 also includes segments that extend between and couple with both the gate terminal 132 and the drain terminal 118. As mentioned above, including the segments in the segmented net charge region 550 can reduce the ON resistance of the fifth example semiconductor device 500.

Figure 6A:
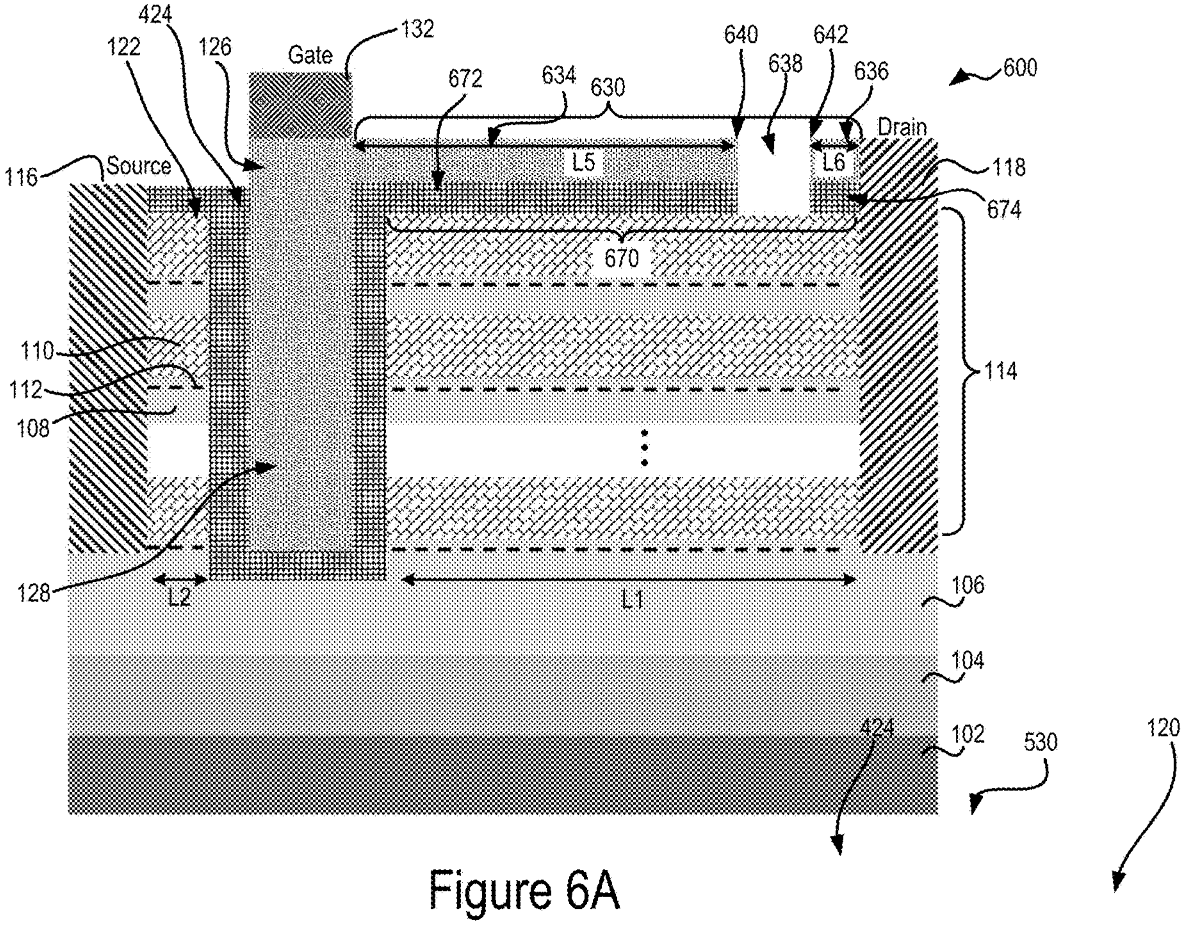
FIGS. 6A-6C show various views of a sixth example semiconductor device.

FIG. 6A shows a sixth example semiconductor device 600. The sixth example semiconductor device 600 is similar to the third example semiconductor device 300 discussed above in relation to FIGS. 3A-3C in that the sixth example semiconductor device 600 includes a net charge region 630 of the third semiconductor region 126, where the net charge region includes a gate-side portion 634 and a drain-side portion 636. To that end, the net charge region 630 can include features discussed above in relation to the net charge region 330 of the third example semiconductor device 300. But the sixth example semiconductor device 600 also includes a net charge portion 670 of the fourth semiconductor region 424, where the net-charge portion 670 of the fourth semiconductor region 424 includes a gate-side portion 672 and a drain-side portion 674. The gate-side portion 634 of the net charge region 630 extends between the gate terminal 132 and a first intermediate position 640, while the drain-side portion 636 of the net charge region 630 extends between the drain terminal 118 and a second intermediate position 642. Similarly, the gate-side portion 672 of the fourth semiconductor region 424 extends between a location below the gate terminal 132 and the first intermediate position 640, while the drain-side portion 674 of the fourth semiconductor region 424 extends between the drain terminal 118 and the second intermediate position 642. The first intermediate position 640 and the second intermediate position 642 are separated by a gap 638.

Figure 6B:
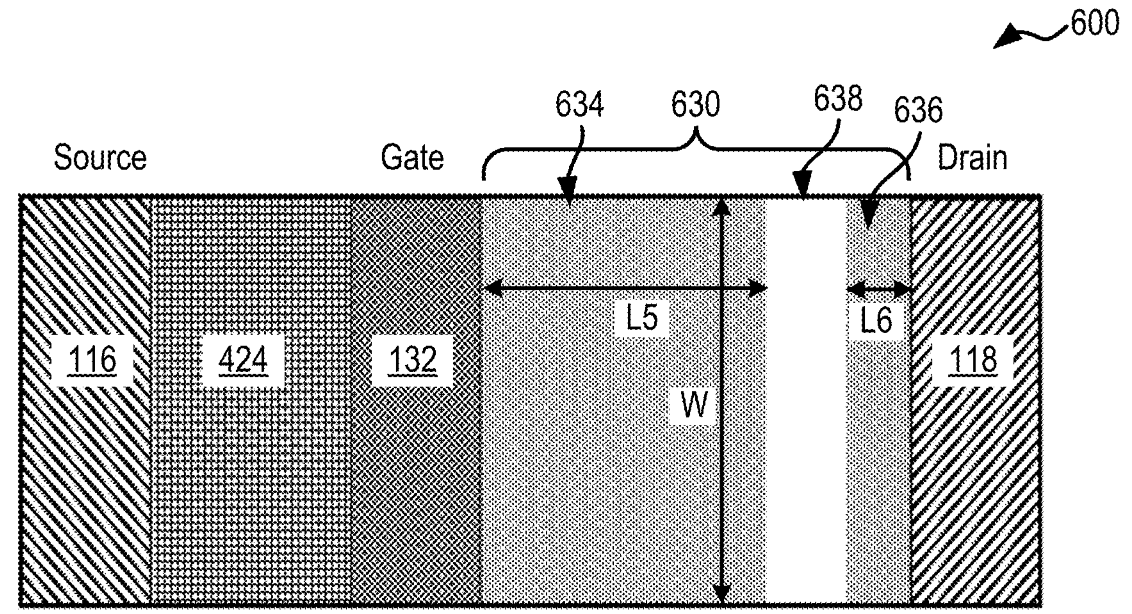

FIG. 6B shows a top view of the sixth example semiconductor device 600 discussed above in relation to FIG. 6A. The sixth example semiconductor device 600 is similar to the third example semiconductor device 300 discussed above in relation to FIGS. 3A-3C in that the sixth example semiconductor device 600 also includes the gate-side portion 634 and the drain-side portion 636 of the net charge region 630. In addition, the sixth example semiconductor device 600 includes a gate-side portion and a drain-side portion associated with the portion of the fourth semiconductor region 424 positioned between the net charge region 630 and the first semiconductor region 120. To maintain net charge balance, the net charge region 630 can be configured to have a net charge that is substantially equal to the sum of the net charge of the portion of the fourth semiconductor region 424 below the net charge region 630 and the net charge of the at least one two-dimensional carrier channel 112 in the first semiconductor region 120. In the example shown in FIG. 6A, the perimeter of the portion of fourth semiconductor region 424 positioned between the net charge region 630 and the first semiconductor region 120 is aligned with the perimeter of the net charge region 630. In some other examples, the perimeter of that portion of the fourth semiconductor region 424 can be different from the perimeter of the net charge region 630. In other words, the dimensions of that portion of the fourth semiconductor region 424 can be different form the dimensions of the net charge region 630.

Figure 6C:
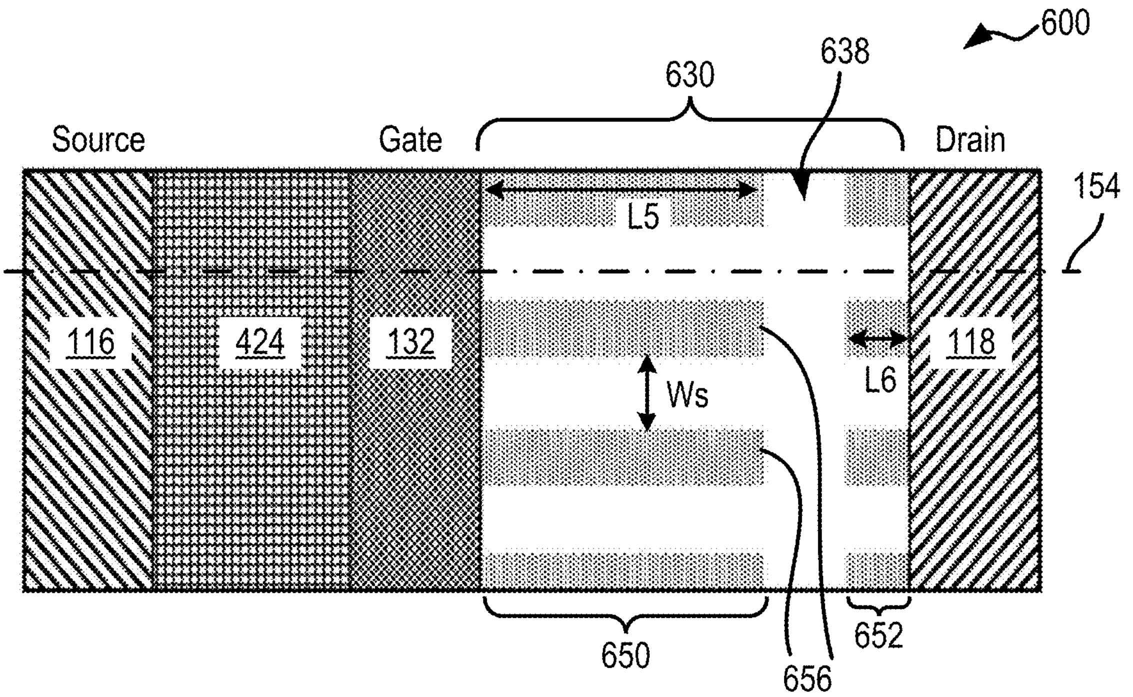

FIG. 6C shows a top view of the sixth example semiconductor device 600 with a segmented net charge region 630. In particular, the sixth example semiconductor device 600 includes a segmented gate-side portion 650 and a segmented drain-side portion 652. The segmented gate-side portion 650 and the segmented drain-side portion 652 can be similar to the segmented gate-side portion 350 and the segmented drain-side portion 352 discussed above in relation to FIGS. 3A-3C. The segmented gate-side portion 650 and the segmented drain-side portion 652 can include features discussed above in relation to the segmented gate-side portion 350 and the segmented drain-side portion 352. In some examples, the number of segments 656 or fins in the segmented gate-side portion 650 can be equal to the number of segments in the segmented drain-side portion 652. In some other examples, the number of segments in the segmented gate-side portion 650 can be different from the number of segments in the segmented drain-side portion 652. In some examples, the separation Ws between the segments in segmented gate-side portion 650 can be the same as the separation between the segments in the segmented drain-side portion 652. In some other examples, the separation between the segments 656 in the segmented gate-side portion 650 can be different from the separation between the segments in the segmented drain-side portion 652. In some examples, the underlying portion of the fourth semiconductor region 424 can have a perimeter that is different from the perimeter of the segmented net charge region 650. For example, the portion of the 424 disposed between the first semiconductor region 120 and the net charge region 630 can have a larger surface area than that of the segmented net charge region 630 (including the segmented gate-side portion 650 and the segmented drain-side portion 652). The net charge region 630 can be configured, taking into account the surface area and thickness of the underlying portion of the fourth semiconductor region 424, to balance the net charge of the net charge region 630 with the sum of the net charge of the underlying portion of the fourth semiconductor region 424 and the net charge of the carrier channels in the first semiconductor region 120.

Figure 7A:
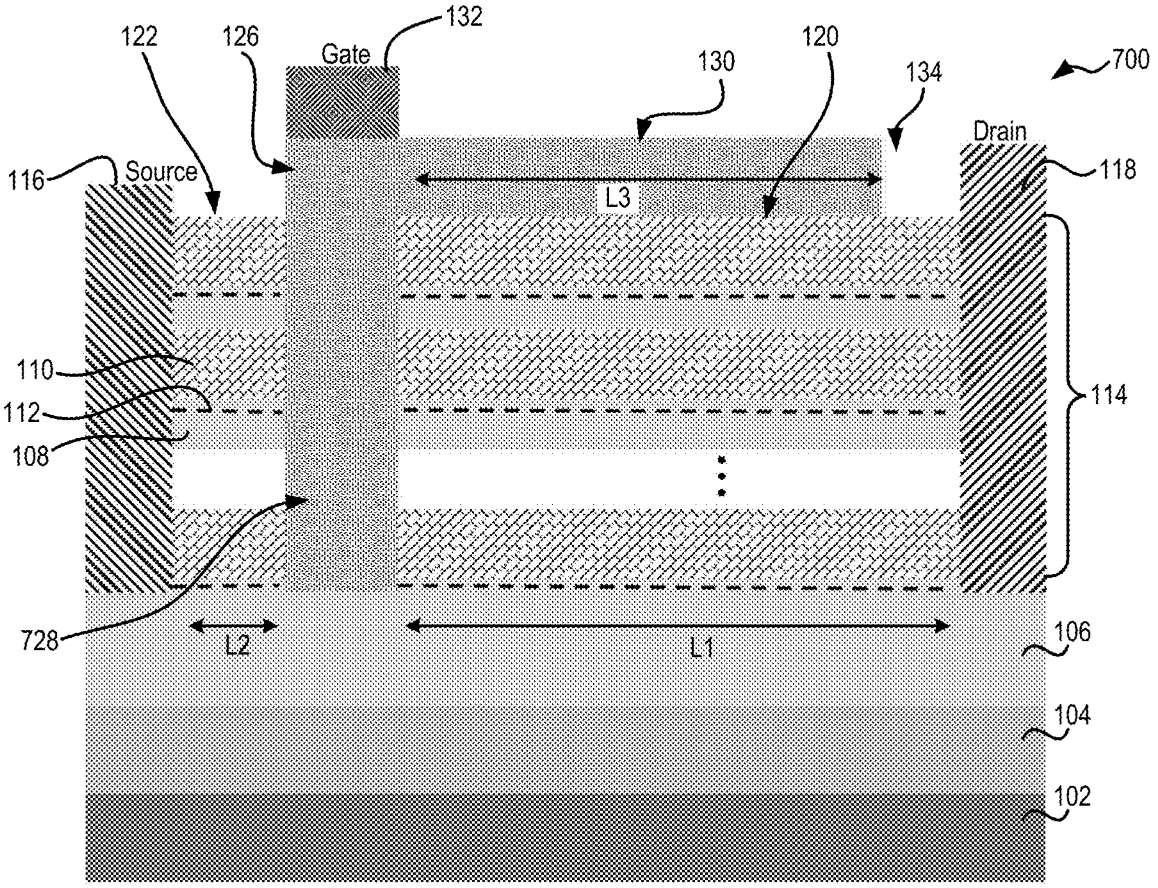
FIGS. 7A-7C show various views of a seventh example semiconductor device.
Figure 7B:
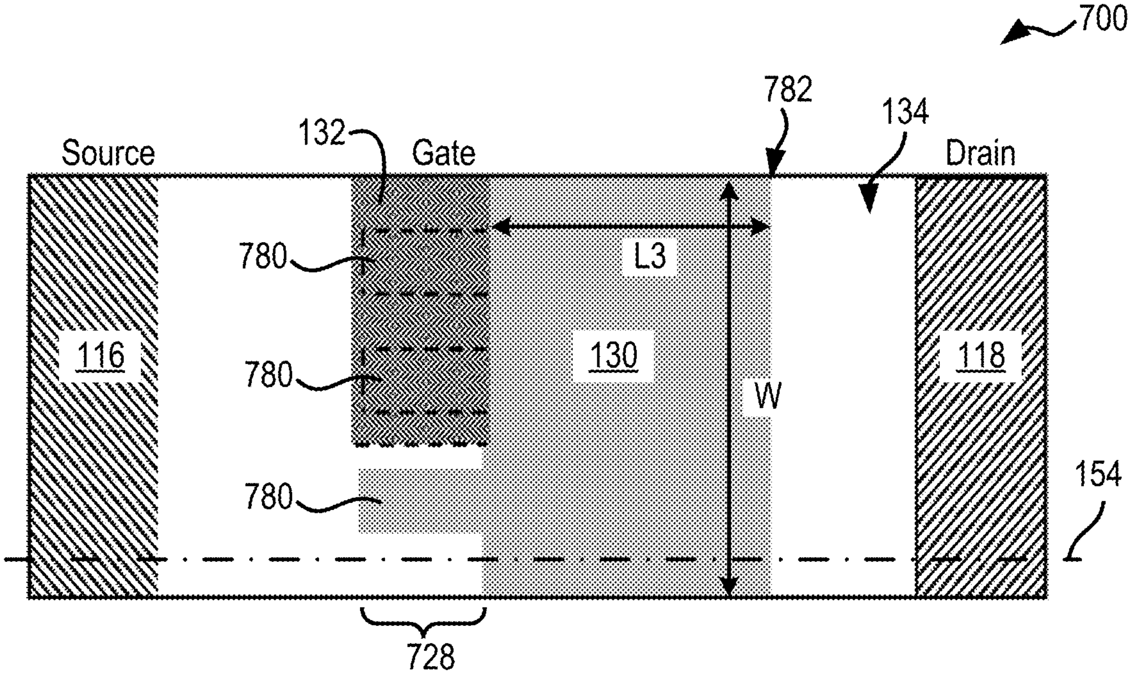

FIG. 7A shows a cross-sectional view of a seventh example semiconductor device 700, and FIG. 7B shows a top view of the seventh example semiconductor device 700. The seventh example semiconductor device 700 is similar to the first example semiconductor device 100 discussed above in relation to FIGS. 1A-1D in that the seventh example semiconductor device 700 also includes the semiconductor region 114, having the first semiconductor region 120 and the second semiconductor region 122, and the third semiconductor region 126 including a gate region 728 and the net charge region 130. However, the seventh example semiconductor device 700 does not include the fourth semiconductor region 124 disposed between the gate region 128 and the first semiconductor region 120 or the second semiconductor region 122. Instead, the current path between the source terminal 116 and the drain terminal 118 is provided by gaps in portions of the gate region 728. In particular, the gate region 728 can include a plurality of sub-regions that are separated by portions of the semiconductor region 114. FIG. 7B shows the top view of the gate terminal 132 and the underlying sub-regions 780 of the gate region 728. A portion of the gate terminal 132 towards the bottom of the figure is removed to show the underlying structure of the gate region 728 more clearly. Normally, the gate terminal 132 would be coupled with all the underlying sub-regions 780. Each of the underlying sub-regions 780 can extend between the gate terminal 132 and the bottom of the i-GaN layer 106. In addition, in a direction lateral to the longitudinal axis 154 of the seventh example semiconductor device 700, any two adjacent sub-regions 780 are separated by the semiconductor region 114. That is, the at least one two-dimensional carrier channel 112 of the semiconductor region 114 are positioned between any two adjacent sub-regions 780 of the gate region 728. The sub-regions 780 can be evenly distributed in a lateral direction in relation to the longitudinal axis 154. That is, the separation between any two adjacent sub-regions 728 is equal. In some other examples, this separation can be unequal, and the sub-regions can be unevenly distributed. The widths of all the sub-regions 780 can be equal in some examples. In some other examples, the widths of at least two sub-regions 780 can be unequal. The sub-regions 780 are arranged substantially parallel to the direction of the longitudinal axis 154. In some examples, the sub-regions 780 and, in particular, the sidewalls of the sub-regions 780 can form a non-zero angle with the longitudinal axis 154.

Each of the sub-regions 780, near the gate terminal 132, is coupled with the net charge region 130 positioned over the top surface of the first semiconductor region 120. The first semiconductor region 120, as discussed above in relation to other examples, extends between the gate terminal 132 and a first intermediate position 782 between the gate terminal 132 and the drain terminal 118, thereby defining a gap 134 between the net charge region 130 and the drain terminal 118. While FIG. 7B shows only three sub-regions 780, at least two sub-regions 780 may be included. The net charge region 130 can be configured to balance the net charges of the net charge region 130 with the net charges of the carrier channels in the underlying first semiconductor region 120, as has been discussed above in relation to various other examples.

Figure 7C:
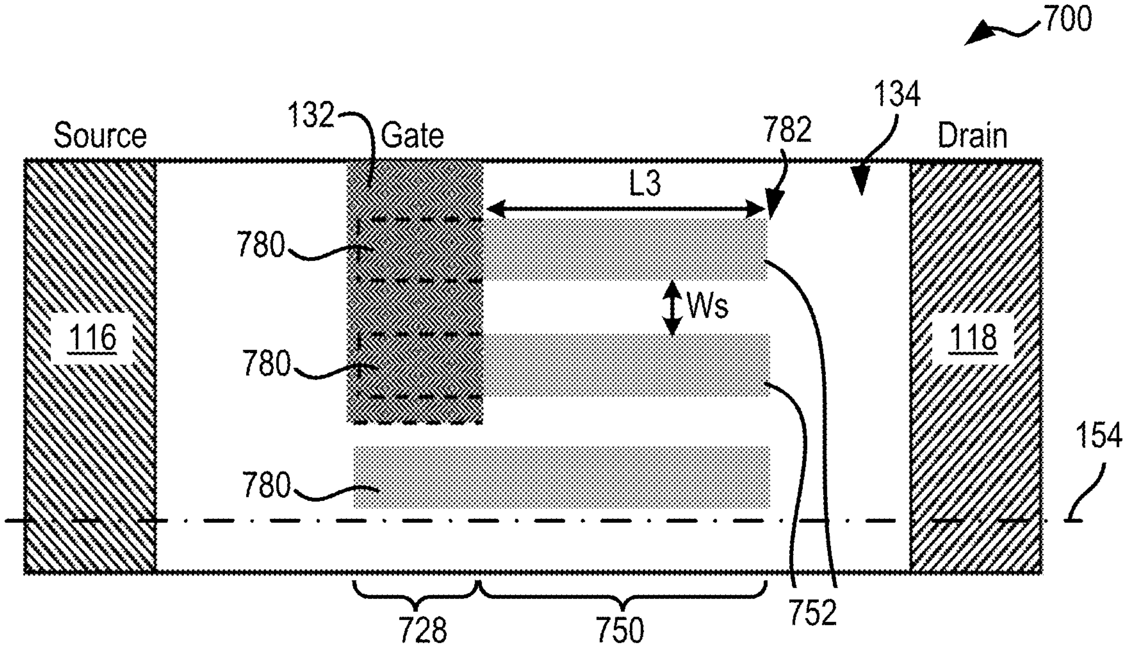

FIG. 7C shows the seventh example semiconductor device 700 with a segmented net charge region 750. The segmented net charge region 750 includes a plurality of segments 752 that extend between the gate terminal 132 and the first intermediate position 782. Each segment is coupled with one of the sub-regions 780 of the gate region 728 (the third semiconductor region 126). In some examples, there may not be a one-to-one correspondence between the segments 752 and the sub-regions 780. For example, an intermediate third semiconductor region 126 can be positioned between the sub-regions 780 and the segments 752, where the number of sub-regions 780 can be different from the number of segments 752. The segments 752 can be separated by a gap of width Ws. In some examples, the gaps between pairs of adjacent segments 752 can be equal in width. In some other examples, the widths of the gaps can be unequal. In some examples, the lengths of the segments 752 can be equal to L3. In some other examples, at least two of the segments 752 can have unequal lengths along the longitudinal axis 154.

Figure 8A:
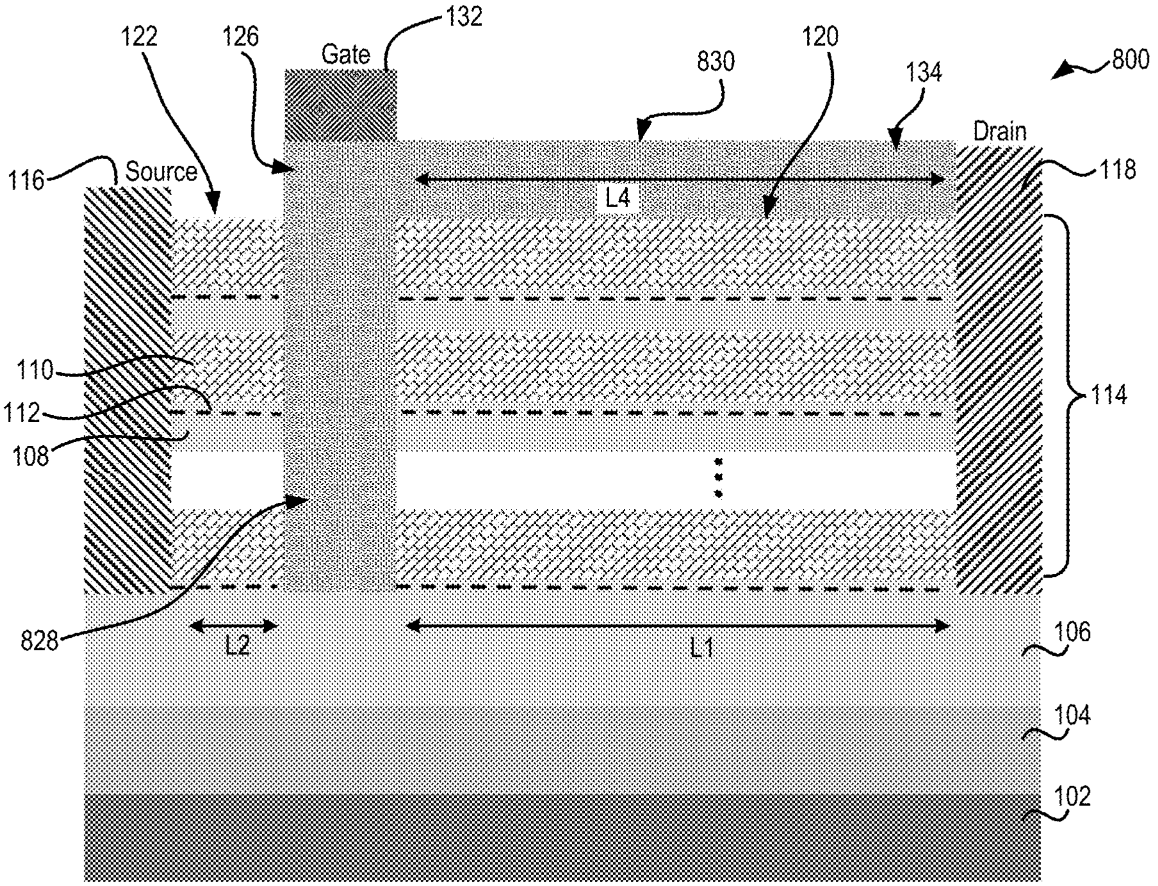
FIGS. 8A-8C show various views of an eighth example semiconductor device.
Figure 8B:
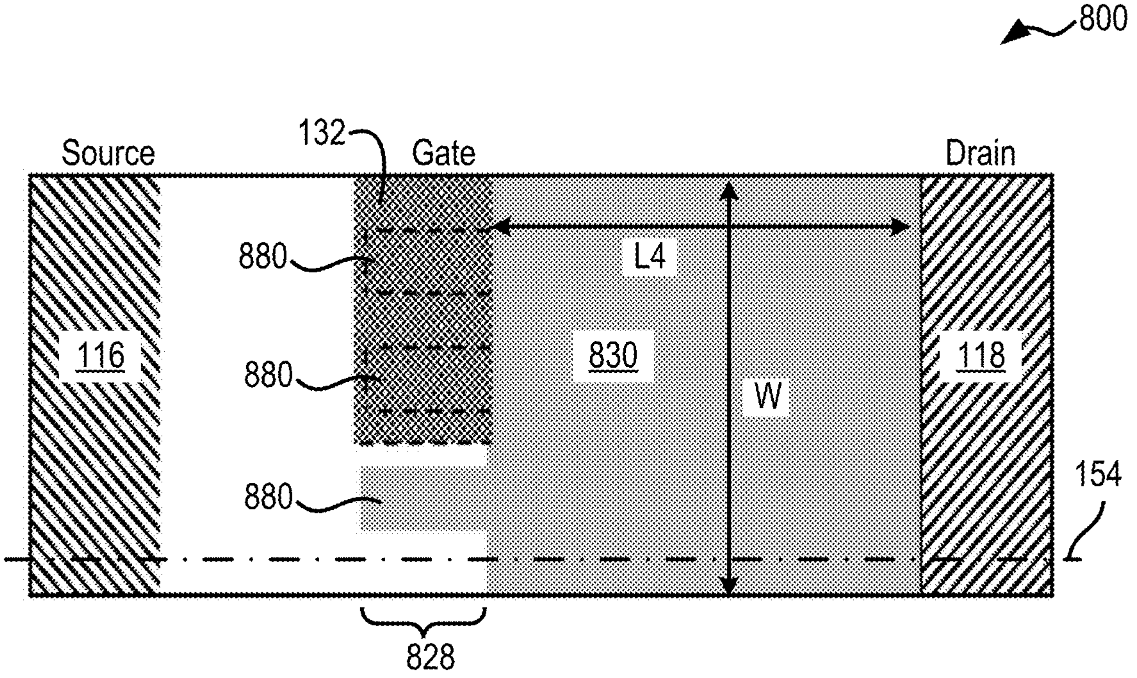

FIG. 8A shows a cross-sectional view of an eighth example semiconductor device 800. The eighth example semiconductor device 800 is similar to the seventh example semiconductor device 700 discussed above in relation to FIGS. 7A-7C. But unlike the net charge region 130 in FIG. 7A-7C, which extended only up to an intermediate position 782, a net charge region 830 of the eighth example semiconductor device 800 extends between and is coupled with both the gate terminal 132 and the drain terminal 118. In that respect, the net charge region 830 can include features discussed above in relation to the net charge region 230 of the second example semiconductor device 200 and shown in FIGS. 2A and 2B. FIG. 8B shows a top view of the eighth example semiconductor device 800 shown in FIG. 8A. The gate region 828 includes two or more sub-regions 880, which are similar to the sub-regions 780 of the seventh example semiconductor device 700 discussed above in relation to FIGS. 7A-7C. The eighth example semiconductor device 800 includes the net charge region 830 which extends (with length L4) between and is coupled with the gate terminal 132 and the drain terminal 118. The net charge region 830 also extends the width W of the eighth example semiconductor device 800. The net charge region 830 is also coupled with each of the two or more sub-regions 880.

Figure 8C:
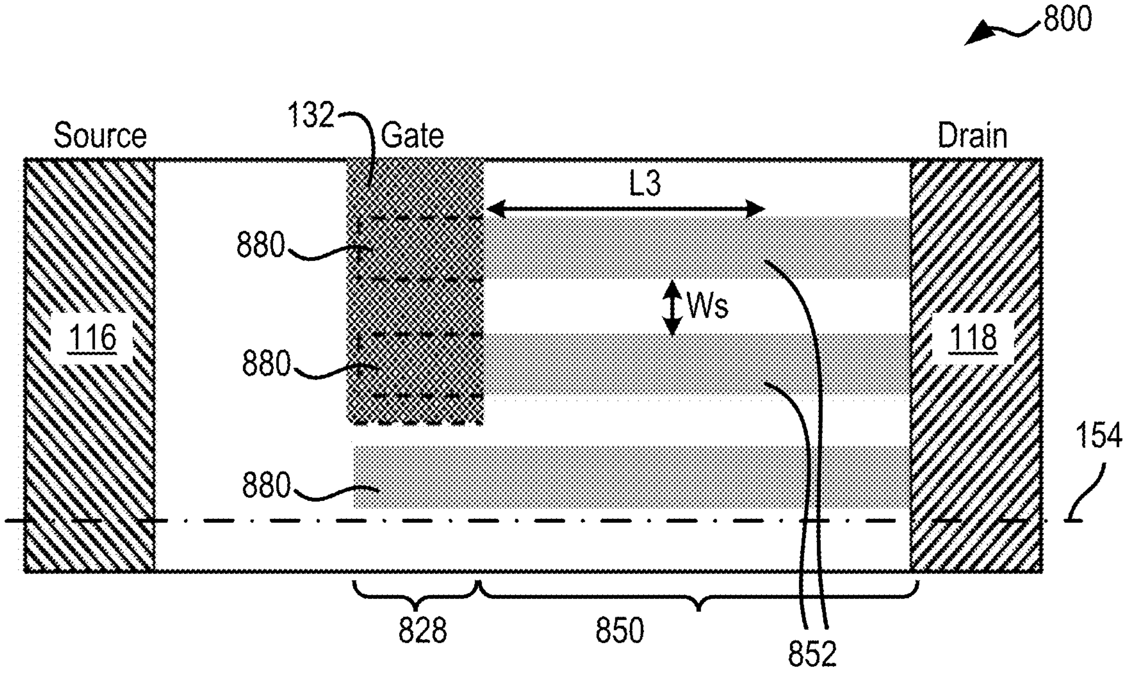

FIG. 8C shows a top view of the eighth example semiconductor device 800 with a segmented net charge region 850. The segmented net charge region 850 can include segments 852 that extend between and are coupled with the gate terminal 132 and the drain terminal 118. The segments 852 can be separated by a width Ws, which in some examples can be the same between any two segments 852. In some other implementations, the segments can be unevenly distributed along the width of the eighth example semiconductor device 800. In some instances, each of the segments 852 can have equal width. In some other examples, at least two of the segments 852 can have unequal widths. In the example shown in FIG. 8C, the number of segments 852 is equal to the number of two or more sub-regions 880. In some other examples, the number of segments 852 may not be equal to the number of two or more sub-regions 880. In some such instance, an intermediate third semiconductor region 826 can be positioned between the two or more sub-regions 880 and the segments 852.

Figure 9A:
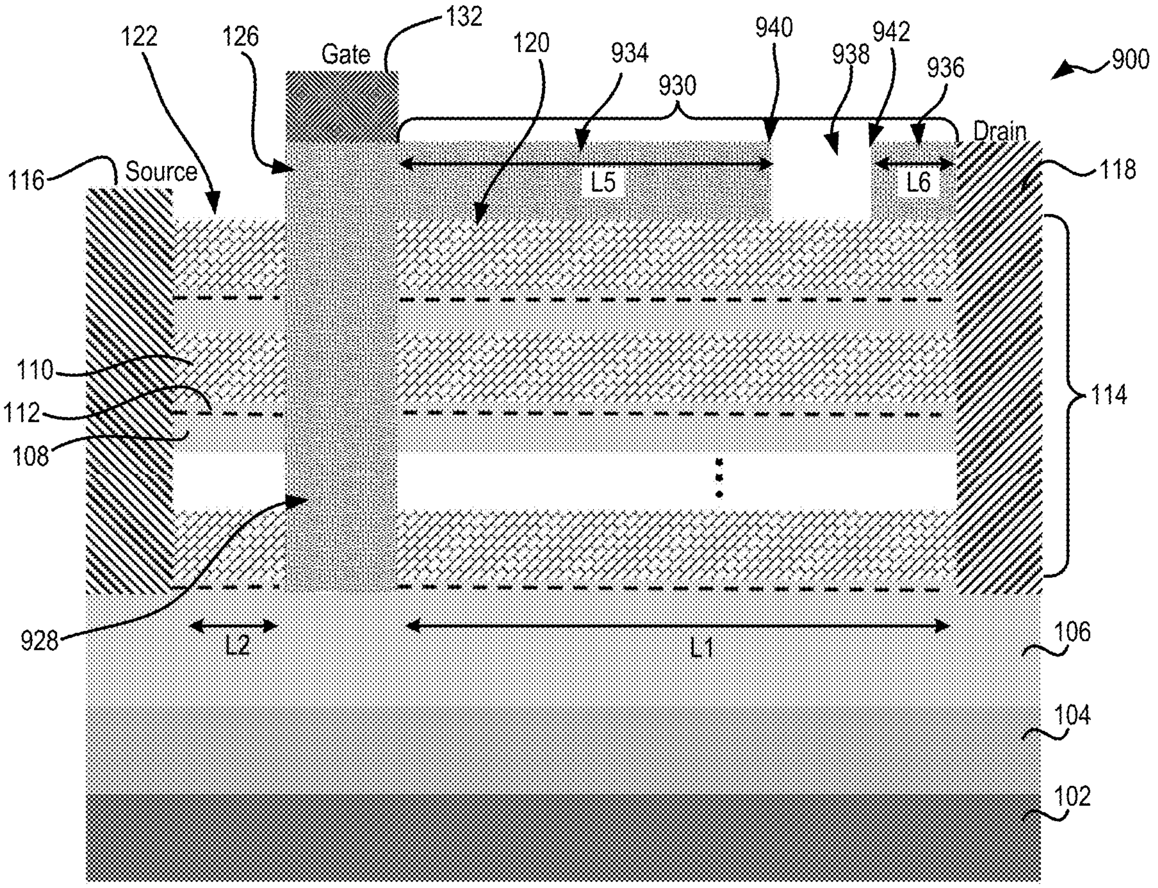
FIGS. 9A-9C show various views of a ninth example semiconductor device.
Figure 9B:
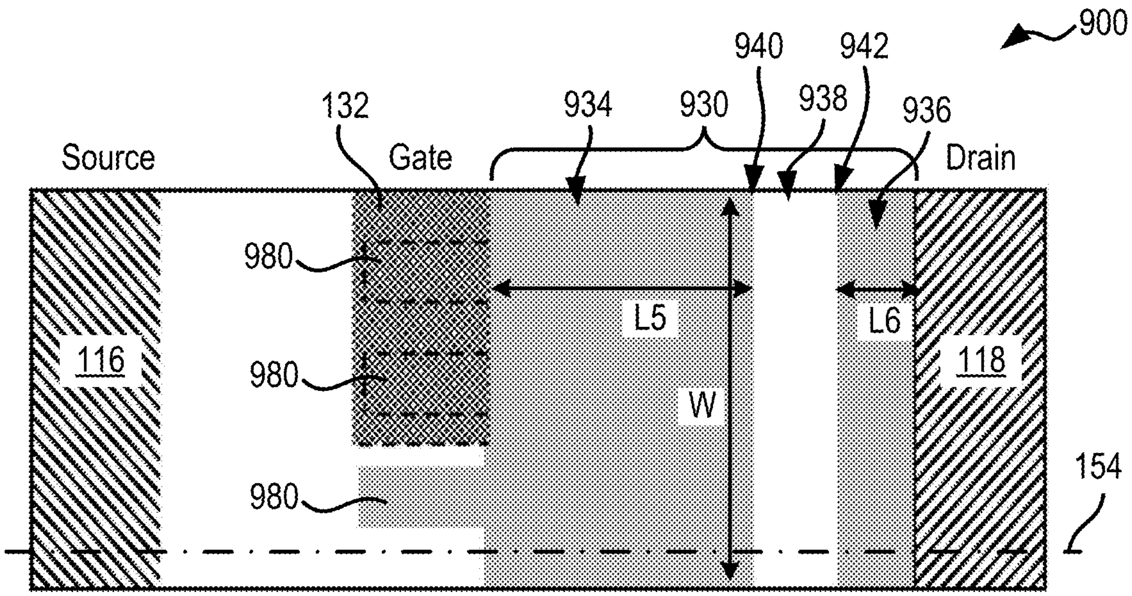

FIG. 9A shows a ninth example semiconductor device 900. The ninth example semiconductor device 900 is similar to the seventh example semiconductor device 700 discussed above in relation to FIGS. 7A-7C and to the eighth example semiconductor device 800 discussed above in relation to FIGS. 8A-8C in that the ninth example semiconductor device 900 also has (as shown in FIG. 9B) a gate region 928 that includes two or more sub-regions 980. The ninth example semiconductor device 900 is also similar to the third example semiconductor device 300 discussed above in relation to FIGS. 3A-3C and to the sixth example semiconductor device 600 discussed above in relation to FIGS. 6A-6C in that the ninth example semiconductor device 900 includes a net charge region 930 of the third semiconductor region 126, where the net-charge region 930 includes a gate-side portion 934 and a drain-side portion 936. The gate-side portion 934 of the net charge region 930 extends between the gate terminal 132 and a first intermediate position 940, while the drain-side portion 936 of the net charge region 930 extends between the drain terminal 118 and a second intermediate position 942. The first intermediate position 940 and the second intermediate position are separated by a gap 938. The net charge region 930 including the gate-side portion 934 and the drain-side portion 936, has a net charge that is substantially equal to the net charge of the underlying semiconductor region 114 during the OFF state of the ninth example semiconductor device 900.

FIG. 9B shows the top view of the ninth example semiconductor device 900 shown in FIG. 9A. The sub-regions 980 are coupled with the gate-side portion 934, which extends (with length L5) between the gate terminal 132 and the first intermediate position 940 and also extends the width W of the ninth example semiconductor device 900. The drain-side portion 936 extends (with length L6) along the longitudinal axis 154 between the drain terminal 118 and the second intermediate position 942 and extends laterally in relation to the longitudinal axis 154 the width W of the ninth example semiconductor device 900.

Figure 9C:
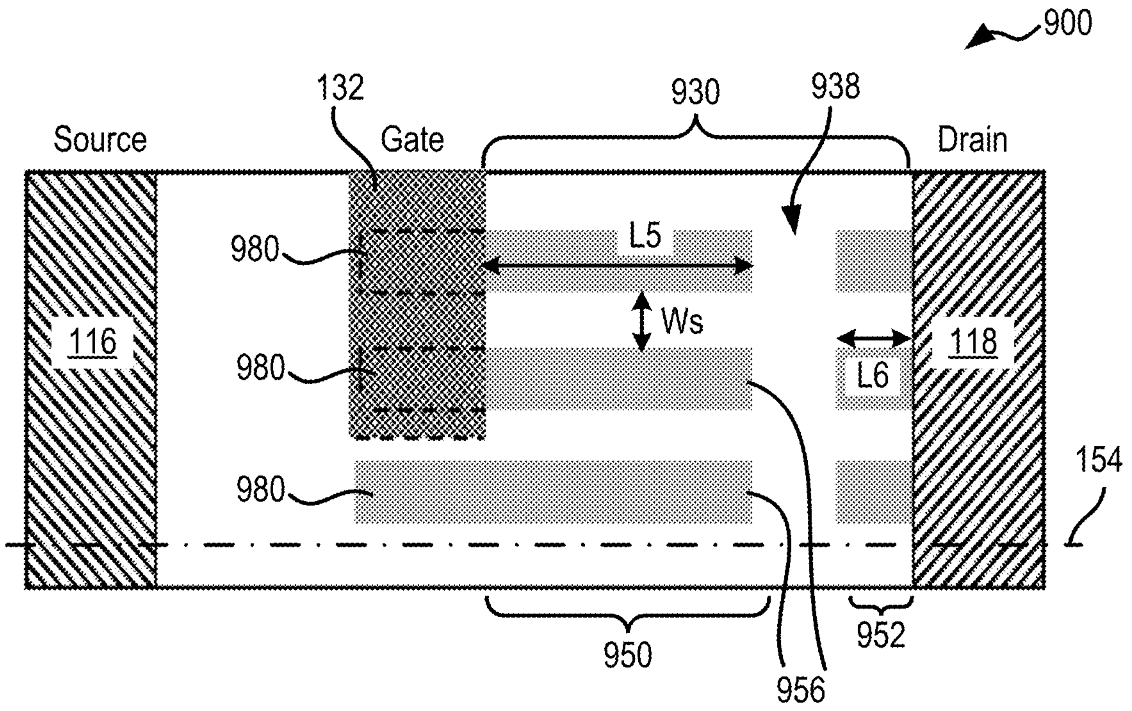

FIG. 9C shows a top view of the ninth example semiconductor device 900 with a segmented net-charge region 930. In particular, the ninth example semiconductor device 900 includes a segmented gate-side portion 950 and a segmented drain-side portion 952. The segmented gate-side portion 950 and the segmented drain-side portion 952 can be similar to the segmented gate-side portion 650 and the segmented drain-side portion 652 of the sixth example semiconductor device 600 discussed above in relation to FIG. 6C. The segmented gate-side portion 950 can include segments 956 that extend between the gate terminal 132 and the first intermediate position 940. Similarly, the segmented drain-side portion 952 also can include segments that extend between the drain terminal 118 and the second intermediate position 942. Aspects discussed above in relation to the segmented gate-side portion 650 and segmented drain-side portion 652 above can also be associated with the segmented gate-side portion 950 and the segmented drain-side portion 952 of the ninth example semiconductor device 900.

FIG. 10 shows a tenth example semiconductor device 1000. The tenth example semiconductor device 1000 includes a gate region 1028, of a third semiconductor region 1026, that has a plurality of sub-regions. FIG. 10B shows a cross-sectional view of the tenth example semiconductor device 1000 along a plane 1002 that is normal to the at least one two-dimensional carrier channel 112 and lateral in relation to the longitudinal axis of the tenth example semiconductor device 1000. FIG. 10B shows two sub-regions 1060 formed in the gate region 1028. In a direction normal to the top surface of the semiconductor region 114, the two sub-regions 1060 extend between the top surface of the semiconductor region 114 and a location below the lowermost two-dimensional carrier channel. In some instances, the two sub-regions 1060 may terminate above one or more lowermost two-dimensional carrier channels as long as the two sub-regions 1060 terminate below at least one two-dimensional carrier channel. In a direction along the longitudinal axis of the tenth example semiconductor device 1000, the two sub-regions 1060 extend by a length L7, which is also the length of the gate region 1028. In a direction lateral to the longitudinal axis of the tenth example semiconductor device 1000, the each of the two sub-regions 1060 can have a width Wsr. As shown in FIG. 10B, the two sub-regions 1060 are separated by a portion of the semiconductor region 114. This portion allows current flow between the first semiconductor region 120 and the second semiconductor region 122 and thereby between the source terminal 116 and the drain terminal 118 when the tenth example semiconductor device 1000 is in the ON state.

A metal oxide material 1062 is disposed over sidewalls 1064 of the two sub-regions 1060. The metal oxide material 1062 is also disposed over a bottom surface of each of the two sub-regions 1060, where the bottom surface is formed in the i-GaN layer 106. The metal oxide material 1062 is also disposed over a top surface of the semiconductor region 114. In particular, the metal oxide material 1062 over the top surface of the semiconductor region 114 is positioned to make contact with the metal oxide material 1062 disposed over the sidewalls 1064 of the adjacent sub-region 1060. The metal oxide material 1062 within the two sub-regions 1060 defines cavities 1066 that expose internal sidewalls 1068 of the metal oxide material 1062. These internal sidewalls 1068 of the metal oxide material 1062 are covered at least with the gate terminal 132.

Figure 10A:
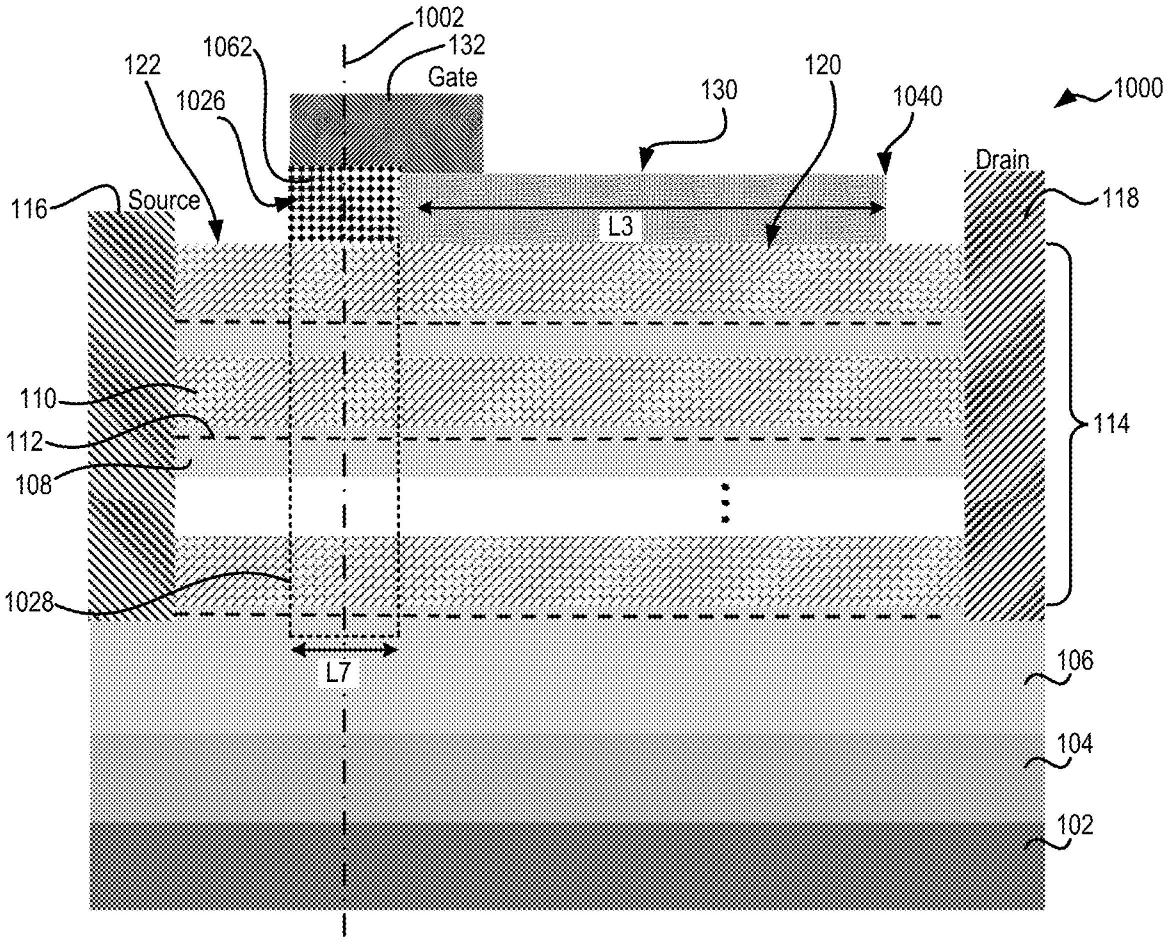
FIGS. 10A-10D show various views of a tenth example semiconductor device.
Figure 10B:
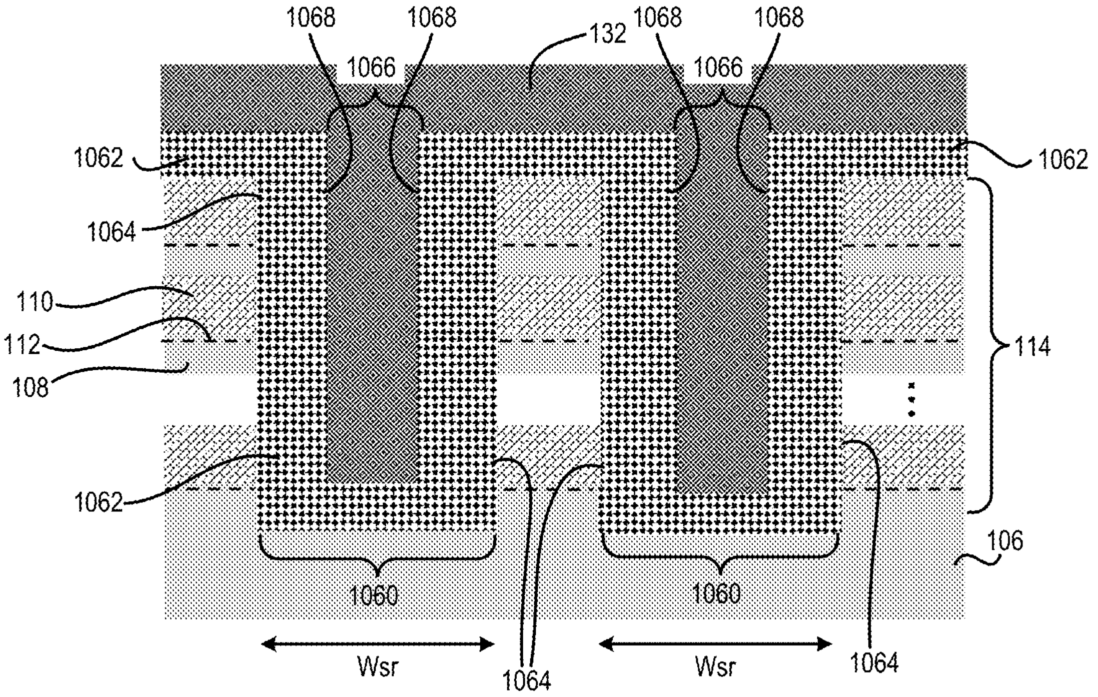
Figure 10C:
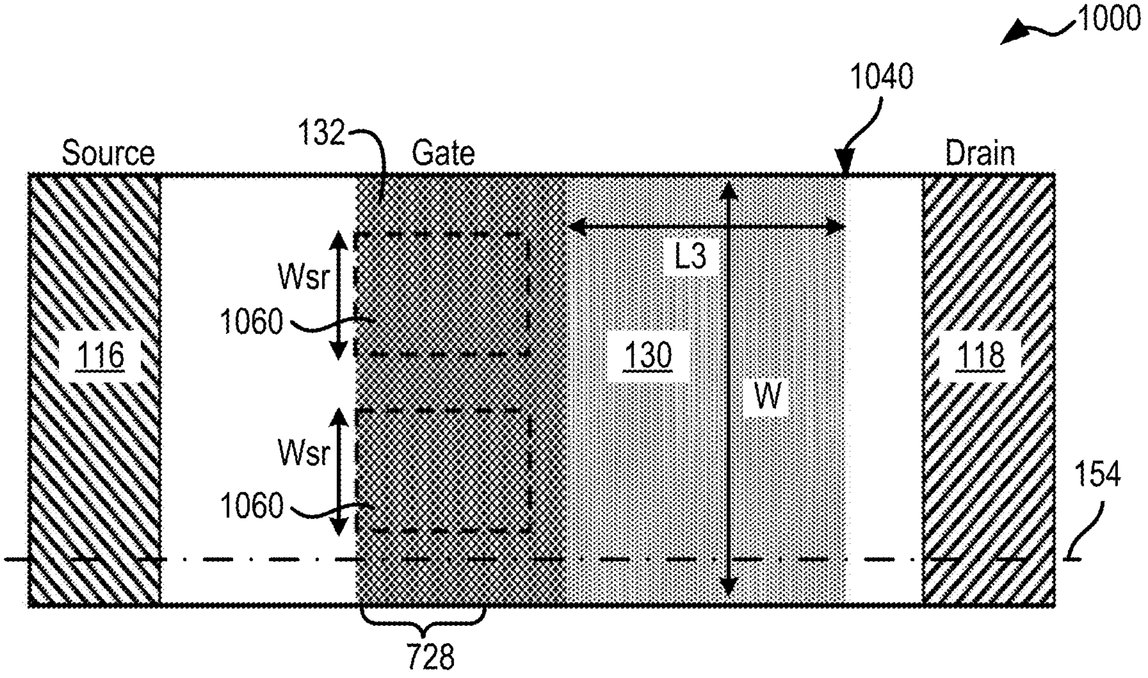

Referring again to FIG. 10A, the third semiconductor region 1026 also includes the net charge region 130, which extends (with length L3) between the gate terminal 132 and a first intermediate position 1040 between the gate terminal 132 and the drain terminal 118. The net charge region 130 makes contact not only with the gate terminal 132 but also with the metal oxide material 1062 below the gate terminal 132. As with the net charge region 130 discussed above in relation to other examples, the net charge in the net charge region 130 is substantially equal to the net charge of the at least one two-dimensional carrier channel 112 in first semiconductor region 120 of the semiconductor region 114. FIG. 10C shows a top view of the tenth example semiconductor device 1000 shown in FIG. 10A. Boundaries of the two sub-regions 1060 underlying the gate terminal 132 are shown in broken lines. The net charge region 130 extends along the entire width W of the tenth example semiconductor device 1000.

Figure 10D:
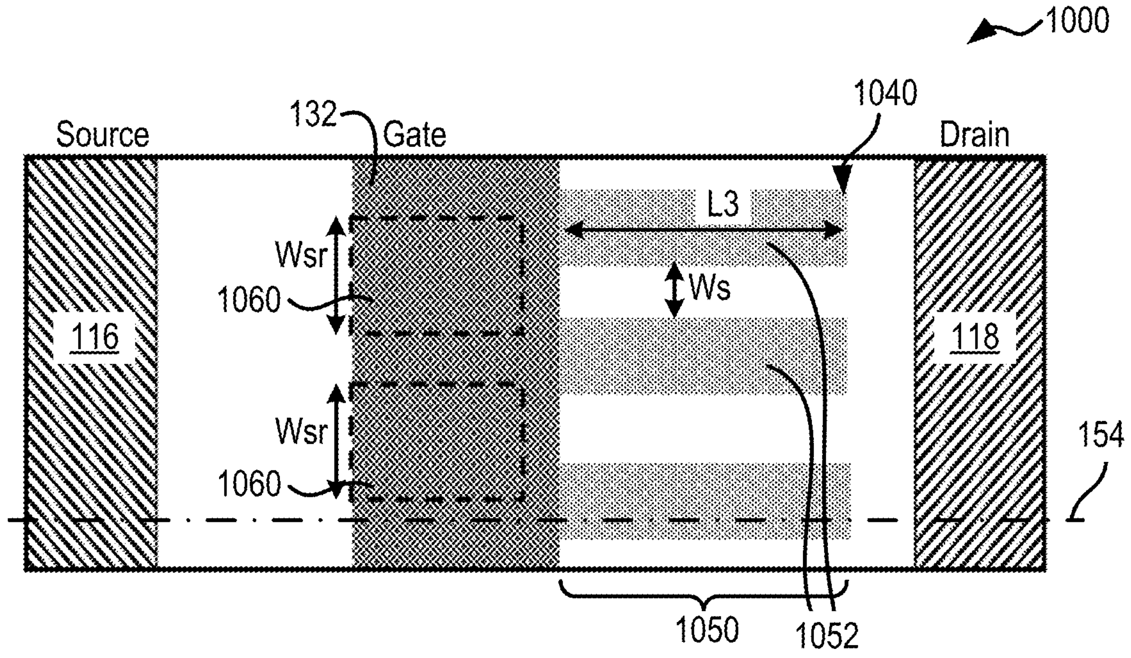

FIG. 10D shows the tenth example semiconductor device 1000 with a segmented net charge region 1050. The segmented net charge region 1050 includes segments 1052 that extend between the gate terminal 132 and the first intermediate position 1040 between the gate terminal 132 and the drain terminal 118. The segmented net charge region 1050 can include feature discussed above in relation to the segmented net charge region 150 of the first example semiconductor device 100.

Figure 11A:
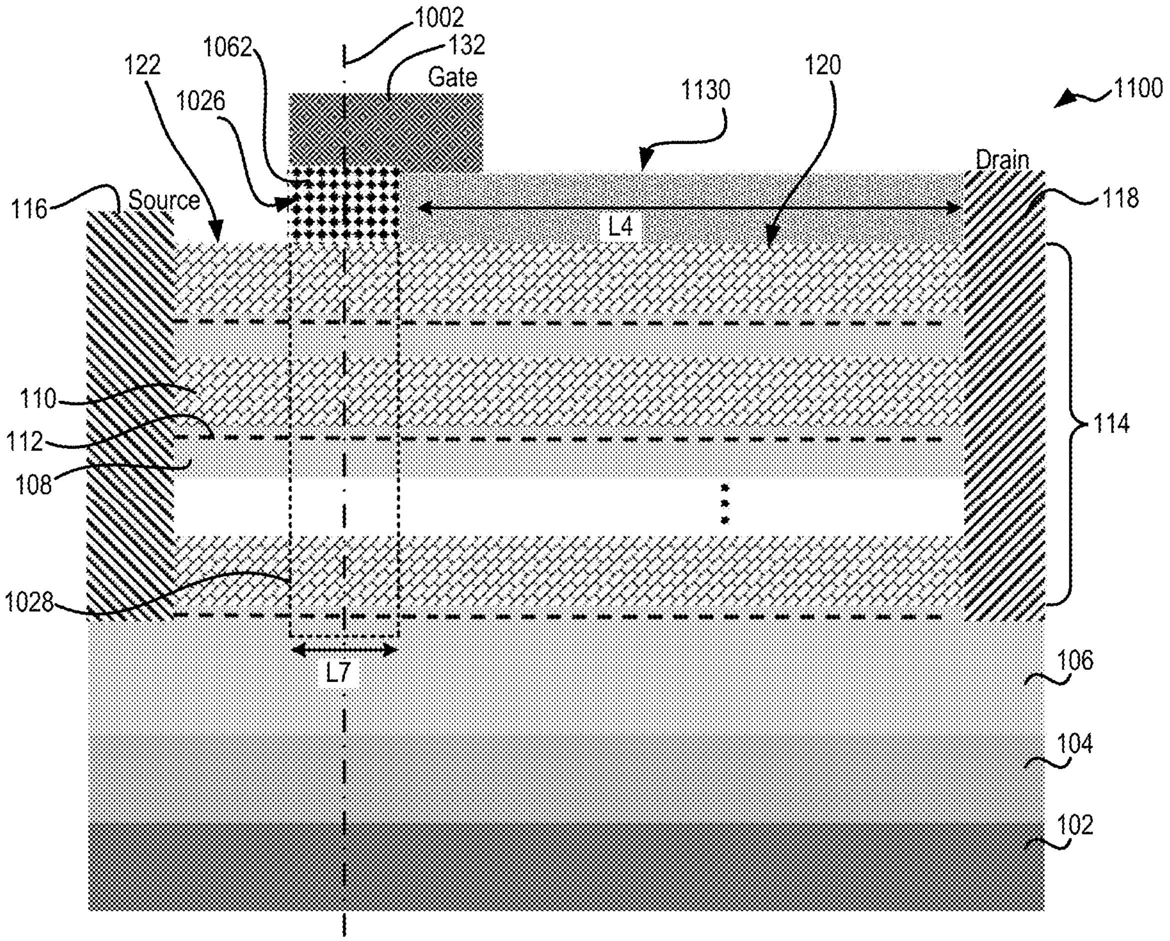
FIGS. 11A-11C show various views of an eleventh example semiconductor device.

FIG. 11A shows a cross-sectional view of an eleventh example semiconductor device 1100. The eleventh example semiconductor device 1100 is similar to the tenth example semiconductor device 1000 discussed above in relation to FIGS. 10A-10D. But the eleventh example semiconductor device 1100 includes a net charge region 1130 that extends (with length L4) between and is contact with both the gate terminal 132 and the drain terminal 118. The net charge region 1130 also makes contact with the metal oxide material 1062. The third semiconductor region 1026 is similar to that of the tenth example semiconductor device 1000.

Figure 11B:
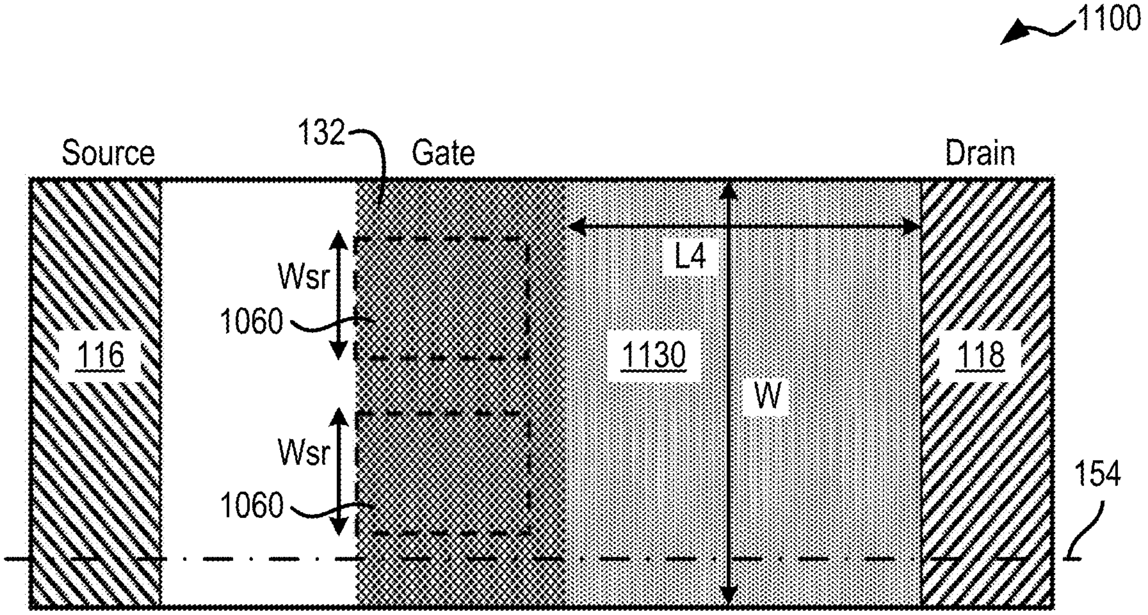
Figure 11C:
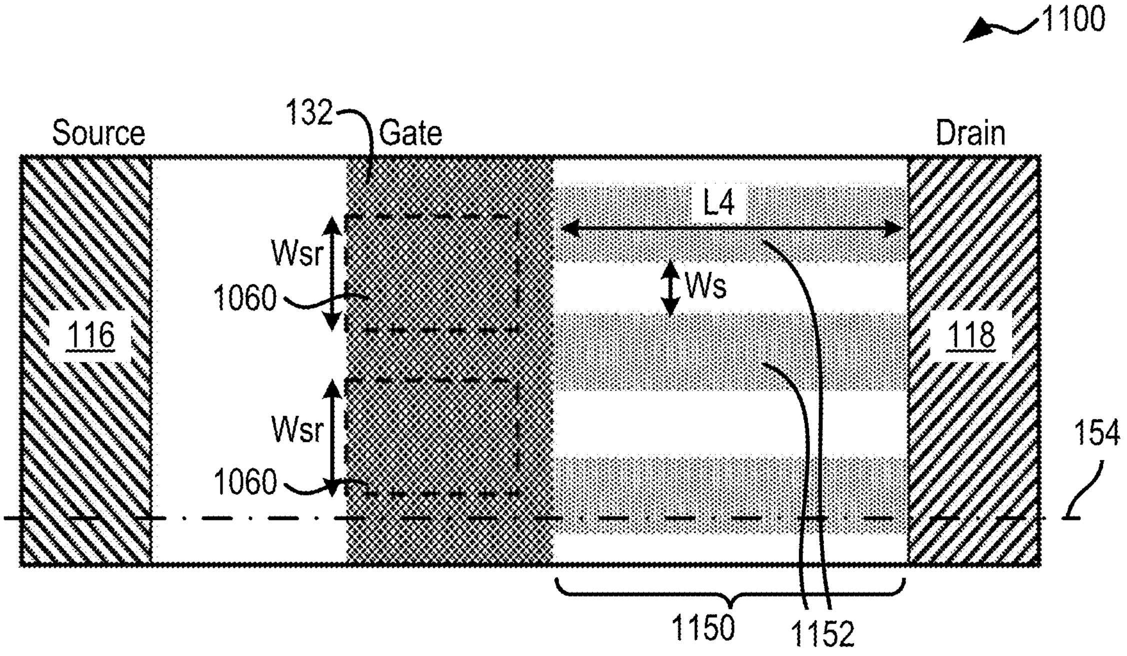

FIG. 11B shows a top view of the eleventh example semiconductor device 1100 shown in FIG. 11A. FIG. 11C shows a top view of the eleventh example semiconductor device 1100 with a segmented net charge region 1150 including segments 1152.

Figure 12A:
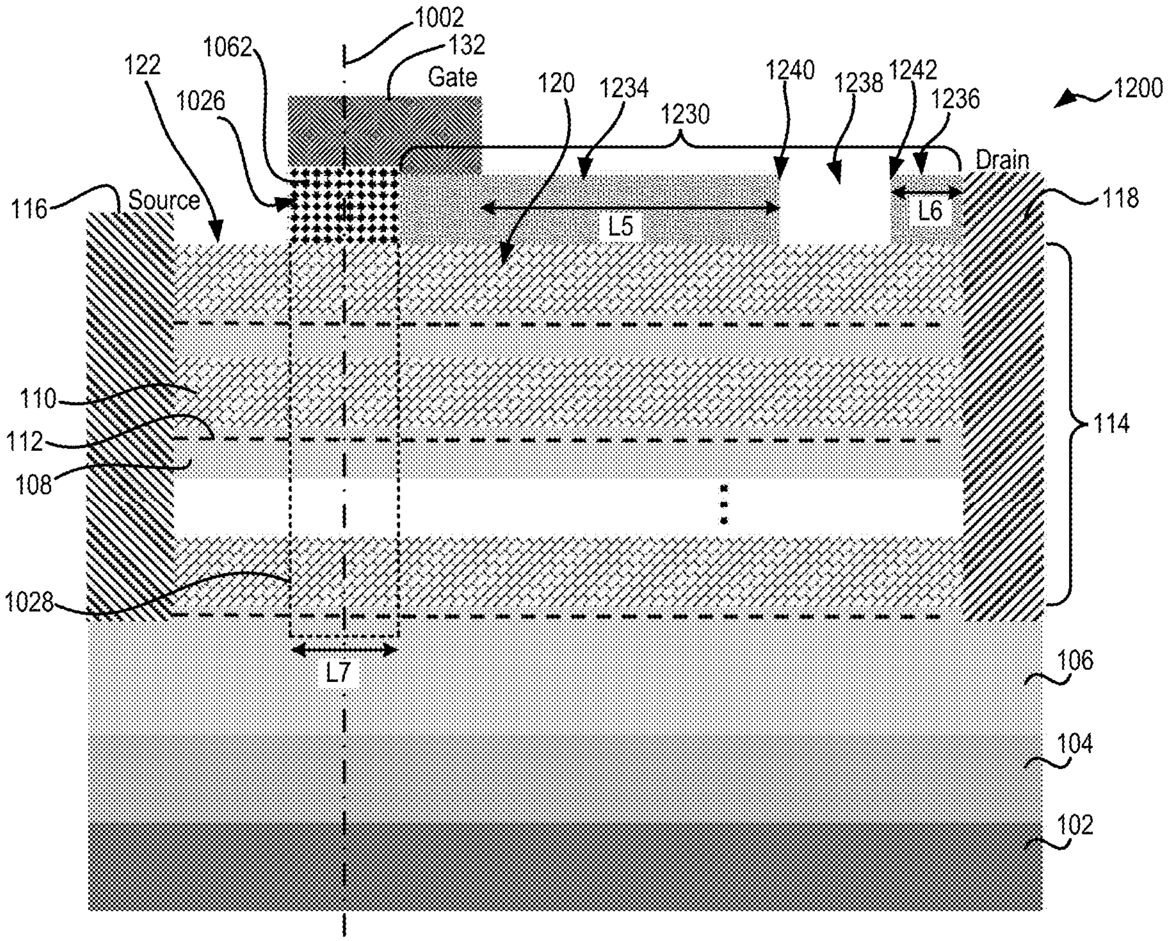
FIGS. 12A-12C show various views of a twelfth example semiconductor device.
Figure 12B:
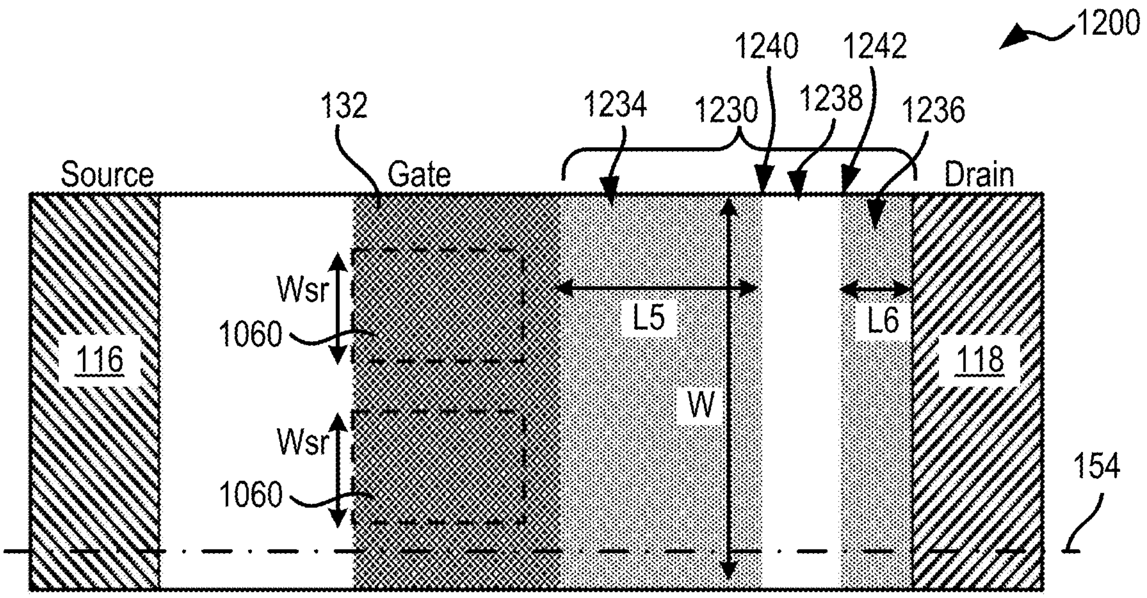
Figure 12C:
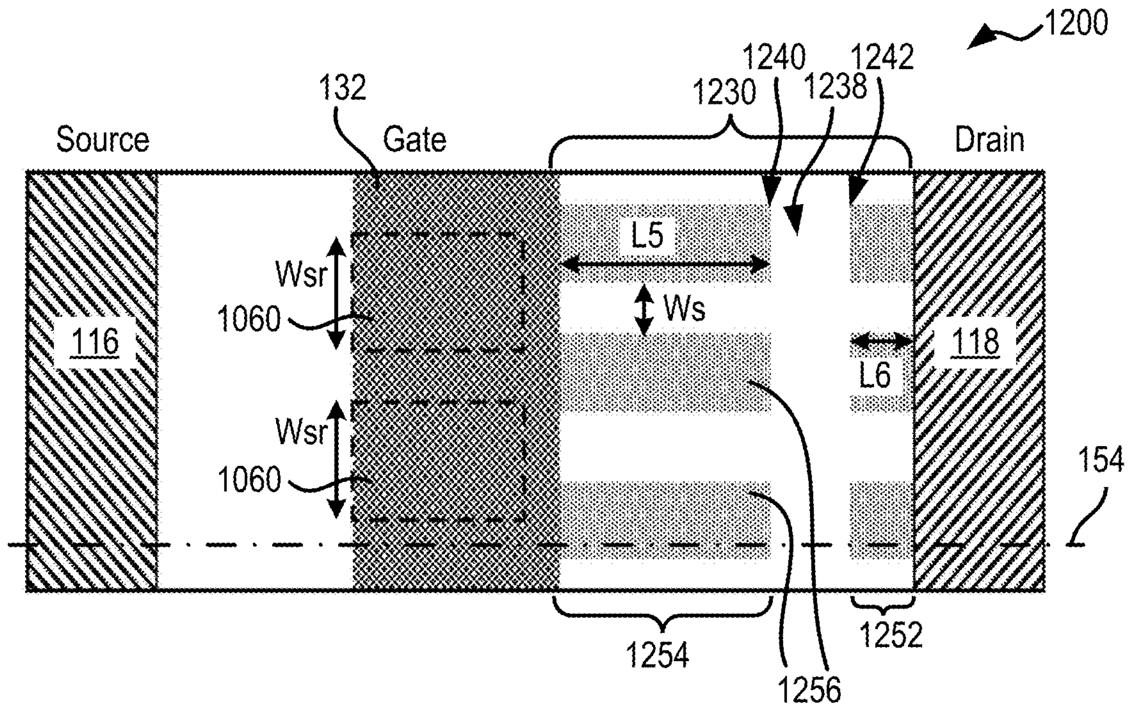

FIG. 12A shows a cross-sectional view of a twelfth example semiconductor device 1200. The twelfth example semiconductor device 1200 is similar to the tenth example semiconductor device 1000 discussed above in relation to FIGS. 10A-10D in that the twelfth example semiconductor device 1200 also includes the third semiconductor region 1026 including the gate region 1028 with two sub-regions 1060. The twelfth example semiconductor device 1200 includes a net charge region 1230 that is similar to the net charge region 330 of the third example semiconductor device 300 discussed above in relation to FIGS. 3A-3B in that the net charge region 1230 also includes a gate-side portion 1234 and a drain-side portion 1236 separated by a gap 1238. The gate-side portion 1234 extends (with length L5) between the gate terminal 132 and a first intermediate position 1240, and the drain-side portion 1236 extends (with length L6) between the drain terminal 118 and a second intermediate position 1242. FIG. 12B shows a top view of the twelfth example semiconductor device 1200 shown in FIG. 12A. Both the gate-side portion 1234 and the drain-side portion 1236 extend laterally to the longitudinal axis 154 with a width W. FIG. 12C shows a top view of the twelfth example semiconductor device 1200 with a segmented net charge region 1250. In particular, the segmented net charge region 1250 includes a segmented gate-side portion 1254 and a segmented drain-side portion 1252. The segmented gate-side portion 1254 includes segments 1256 that extend between the gate terminal 132 and the first intermediate position 1240, and the segmented drain-side portion 1252 includes segments that extend between the drain terminal 118 and the second intermediate position 1242.

References: All cited references, patent or literature, are incorporated by reference in their entirety. The examples disclosed herein are illustrative and not limiting in nature. Details disclosed with respect to the methods described herein included in one example or embodiment may be applied to other examples and embodiments. Any aspect of the present disclosure that has been described herein may be disclaimed, i.e., exclude from the claimed subject matter whether by proviso or otherwise.

[1] J. W. Palmour et al., 2014 Int. Symp. Power Semicond. Devices ICs, pp. 79.
[2] J. Liu et al., in 2020 IEEE Int. Electron Devices Meet., pp. 23.2.
[3] R. Zhang et al., IEEE Trans. Power Electron., vol. 35, pp. 13409, 2020.
[4] Q. Song et al., IEEE Trans. Power Electron., vol. 37, pp. 4148, 2022.
[5] M. Xiao et al., IEEE Electron Device Lett., vol. 42, no. 6, pp. 808, 2021.
[6] M. Xiao et al., in 2021 IEEE Int. Electron Devices Meet., pp. 5.5.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A semiconductor device, comprising:

a semiconductor region having a plurality of alternating first and second material layers deposited on each other, the plurality of alternating first and second material layers forming a plurality of two-dimensional carrier channels of a first conductivity type, the first conductivity type being one of a n-type conductivity or a p-type conductivity, the plurality of two-dimensional carrier channels having a net charge, the semiconductor region including a first semiconductor region coupled with a drain terminal and a second semiconductor region coupled with a source terminal;

a third semiconductor region comprising a third material of a second conductivity type, the second conductivity type being the other of the n-type conductivity or the p-type conductivity, the third semiconductor region having a gate region and a net charge region substantially perpendicular to the gate region, the gate region comprising the third material electrically coupled with a gate terminal and disposed between the first and second semiconductor regions, the third material of the gate region continuously extending through the plurality of alternating first and second material layers forming the plurality of two-dimensional carrier channels, where the plurality of alternating first and second material layers of the first and second semiconductor regions are separated on opposite sides of the third material of the gate region, and the net charge region comprising a layer of the third material coupled to and extending from the third material of the gate region, the layer of third material disposed over and substantially parallel to the plurality of alternating first and second material layers in the first semiconductor region, the net charge region having a net charge in a depletion region within the third material between the gate terminal and the drain terminal that is substantially equal to the net charge of the plurality of two-dimensional carrier channels in the first semiconductor region when the semiconductor device is in an off-state.

2. The semiconductor device of claim 1, wherein the net charge of the net charge region is within ±5% of the net charge of the first semiconductor region.

3. The semiconductor device of claim 2, further comprising:

a fourth semiconductor region comprising a fourth material of the first conductivity type positioned between the first semiconductor region and the third semiconductor region and between the second semiconductor region and the third semiconductor region, the fourth material of the fourth semiconductor region being in contact with the plurality of alternating first and second material layers in each of the first semiconductor region and the second semiconductor region.

4. The semiconductor device of claim 3, wherein the net charge region extends over an entirety of the first semiconductor region between the gate terminal and the drain terminal.

5. The semiconductor device of claim 3, wherein the net charge region includes a plurality of separated segments that extend between the gate terminal and the drain terminal.

6. The semiconductor device of claim 3, wherein the net charge region of the third semiconductor region includes a gate-side portion and a drain-side portion, wherein the gate-side portion extends between the gate terminal and a first intermediate position, and the drain-side portion extends between the drain terminal and a second intermediate position.

7. The semiconductor device of claim 6, wherein the gate-side portion and the drain-side portions each includes a plurality of segments.

8. The semiconductor device of claim 3, wherein the fourth semiconductor region comprises a layer of the fourth material positioned between a top surface of the first semiconductor region and the layer of the third material of the third semiconductor region, wherein the net charge region has the net charge in the depletion region that is substantially equal to a sum of the net charge of the plurality of two-dimensional carrier channels in the first semiconductor region and a net charge of the fourth semiconductor region when the semiconductor device is in the off-state, and wherein the fourth semiconductor region is comprises a layer of the fourth material positioned over the plurality of alternating first and second material layers of the second semiconductor region.

9. The semiconductor device of claim 8, wherein the net charge region and the underlying fourth semiconductor region include a plurality of separated segments.

10. The semiconductor device of claim 8, wherein the net charge of the third semiconductor region and the underlying fourth semiconductor region extend between the gate terminal and a first intermediate position between the gate terminal and the drain terminal.

11. The semiconductor device of claim 10, wherein the net charge region and the underlying fourth semiconductor region include a plurality of segments.

12. The semiconductor device of claim 8, wherein the net charge region of the third semiconductor region and the underlying fourth semiconductor region includes a gate-side portion and a drain-side portion, wherein the gate-side portion extends between the gate terminal and a first intermediate position, and the drain-side portion extends between the drain terminal and a second intermediate position.

13. The semiconductor device of claim 12, wherein the gate-side portion and the drain-side portion each include a plurality of segments.

14. The semiconductor device of claim 1, wherein the gate region includes a plurality of sub-regions, any two sub-regions of the plurality of sub-regions separated by portions of the semiconductor region, and wherein the net charge region extends between the gate terminal and the drain terminal.

15. The semiconductor device of claim 14, wherein the net charge region includes a plurality of segments.

16. The semiconductor device of claim 1, wherein the gate region includes a plurality of sub-regions, any two sub-regions of the plurality of sub-regions separated by portions of the semiconductor region, and wherein the net charge region extends between the gate terminal and an intermediate position between the gate terminal and the drain terminal.

17. The semiconductor device of claim 16, wherein the net charge region includes a plurality of segments.

18. The semiconductor device of claim 1, wherein the gate region includes a plurality of sub-regions, any two sub-regions of the plurality of sub-regions separated by portions of the semiconductor region, and wherein the net charge region includes a gate-side portion and a drain-side portion, wherein the gate-side portion extends between the gate terminal and a first intermediate position, and the drain-side portion extends between the drain terminal and a second intermediate position.

19. The semiconductor device of claim 18, wherein the gate-side portion and the drain-side portion each includes a plurality of segments.

20. The semiconductor device of claim 1, wherein the gate region includes a plurality of sub-regions, any two sub-regions of the plurality of sub-regions separated by portions of the semiconductor region, the semiconductor device further comprising:

a metal-oxide material disposed over sidewalls of the plurality of sub-regions; and wherein the net charge region extends between the gate terminal and the drain terminal.

21. The semiconductor device of claim 20, wherein the net charge region includes a plurality of segments.

22. The semiconductor device of claim 1, wherein the gate region includes a plurality of sub-regions, any two sub-regions of the plurality of sub-regions separated by portions of the semiconductor region, the semiconductor device further comprising:

a metal-oxide material disposed over sidewalls of the plurality of sub-regions; and wherein the net charge region extends between the gate terminal and an intermediate position between the gate terminal and the drain terminal.

23. The semiconductor device of claim 22, wherein the net charge region includes a plurality of segments.

24. The semiconductor device of claim 1, wherein the gate region includes a plurality of sub-regions, any two sub-regions of the plurality of sub-regions separated by portions of the semiconductor region, the semiconductor device further comprising:

a metal-oxide material disposed over sidewalls of the plurality of sub-regions; and wherein the net charge region includes a gate-side portion and a drain-side portion, wherein the gate-side portion extends between the gate terminal and a first intermediate position, and the drain-side portion extends between the drain terminal and a second intermediate position.

25. The semiconductor device of claim 24, wherein each of the gate-side portion and the drain-side portion includes a plurality of segments.

* * * * *